(12) United States Patent
Arimitsu

(10) Patent No.: US 9,837,936 B2
(45) Date of Patent: Dec. 5, 2017

(54) VIBRATION TYPE DRIVE DEVICE, MEDICAL APPARATUS, AND MEDICAL SYSTEM

(71) Applicant: CANON KABUSHIKI KAISHA, Tokyo (JP)

(72) Inventor: Yasumichi Arimitsu, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 1149 days.

(21) Appl. No.: 13/917,100

(22) Filed: Jun. 13, 2013

(65) Prior Publication Data

US 2013/0335085 A1 Dec. 19, 2013

(30) Foreign Application Priority Data

Jun. 15, 2012 (JP) ................... 2012-135445

(51) Int. Cl.
*H02N 2/10* (2006.01)
*H02N 2/16* (2006.01)
*G01R 33/28* (2006.01)

(52) U.S. Cl.
CPC ............. *H02N 2/103* (2013.01); *H02N 2/163* (2013.01); *G01R 33/285* (2013.01)

(58) Field of Classification Search
CPC .... H02N 2/103; H02N 2/0015; H02N 2/0095; H02N 2/067; H02N 2/16; H02N 2/163
USPC .................. 310/323.02, 323.09, 323.17, 334
See application file for complete search history.

(56) References Cited

U.S. PATENT DOCUMENTS

| | | | |
|---|---|---|---|
| 6,274,965 B1* | 8/2001 | Daum | H02N 2/163 310/323.11 |
| 7,115,094 B2* | 10/2006 | Azuma | B06B 1/06 600/459 |
| 7,687,973 B2 | 3/2010 | Oki | |
| 2003/0234596 A1* | 12/2003 | Johansson | H01L 41/0926 310/328 |
| 2007/0145859 A1* | 6/2007 | Kurosawa | H02N 2/0065 310/323.09 |
| 2008/0144186 A1* | 6/2008 | Feng | G02B 3/14 359/666 |
| 2009/0326365 A1* | 12/2009 | Goldenberg | G01R 33/58 600/411 |
| 2011/0012343 A1* | 1/2011 | Gutierrez-Lemini | F16L 27/103 285/223 |
| 2012/0221305 A1* | 8/2012 | Srivastav | G08G 5/0013 703/6 |

FOREIGN PATENT DOCUMENTS

| | | |
|---|---|---|
| JP | 05-344757 A | 12/1993 |
| JP | 06-90572 A | 3/1994 |
| JP | 2000-245175 A | 9/2000 |

* cited by examiner

*Primary Examiner* — Bryan Gordon
(74) *Attorney, Agent, or Firm* — Canon U.S.A., Inc. IP Division

(57) ABSTRACT

One aspect of the invention relates to a vibration type drive device including: a mechanical energy application element; a resilient member provided with the mechanical energy application element; a driven member subjected to a relative displacement with respect to the resilient member due to a vibration excited by the resilient member, wherein the resilient member includes a conductive material, and does not constitute an electric closed loop.

21 Claims, 20 Drawing Sheets

US 9,837,936 B2

VIBRATION TYPE DRIVE DEVICE, MEDICAL APPARATUS, AND MEDICAL SYSTEM

BACKGROUND OF THE INVENTION

Field of the Invention

The present disclosure relates to a vibration drive system to be installed in the vicinity or in the interior of an apparatus configured to perform a diagnosis, measurement, and medical treatment using a magnetic field, or a medical apparatus and a medical system using the vibration type drive device.

Description of the Related Art

In recent years, study and development of an operation-aiding robot on the basis of an image feedback using a magnetic resonance imaging apparatus grow active in a field of medical-aiding robot. The magnetic resonance imaging apparatus of the related art performs an image diagnosis in the form of covering a body surface of a patient by a gantry having a cylindrical shape. In contrast, in recent years, an open magnetic resonance imaging apparatus having a gantry with a large opening or a wide space at a center portion of the gantry is developed, and a probability of interposition of the operation-aided robot or a medical practitioner into the interior of the magnetic resonance imaging apparatus is becoming higher. In contrast, a magnetostatic field in the magnetic resonance imaging apparatus is as very strong as 1.5 [T] to 3.0 [T]. In order to determine three-dimensional positional information in an image acquisition with high degree of accuracy in the interior of the magnetic resonance imaging apparatus, the magnetic field accuracy is controlled with very high degree of accuracy, and a gradient magnetic field which temporally varies in a triaxial direction is applied thereto. Therefore, when using a conductive material which forms a closed loop in the operation-aiding robot or other medical instruments to be brought to the vicinity of or in the interior of the gantry of the magnetic resonance imaging apparatus, Lorentz force generated by a variable magnetic field and an influence on magnetic field controlled with high degree of accuracy are required to be eliminated.

U.S. Pat. No. 6,274,965 B1 describes that components other than a housing in a vibration type drive device used near the magnetic resonance imaging apparatus are formed of a material which does not affect an image arch fact of the magnetic resonance imaging apparatus. Therefore, in U.S. Pat. No. 6,274,965 B1, an example of configuration in which titanium, tantalum, and aluminum as components of the vibration type drive device is disclosed.

SUMMARY OF THE INVENTION

As disclosed in U.S. Pat. No. 6,274,965 B1, the following three points are conceivable when a ring-shaped vibration type drive device is manufactured by using a conductive material as a structure member and is installed in the vicinity or in the interior of a bore of an image diagnosis apparatus in which magnetic resonance is used.

First of all, when a member formed of the conductive material has a closed loop portion forming a closed loop such as a ring, a varying current flowing in the closed loop portion forms a new varying magnetic field by an induced electromotive force generated by temporal variation of a magnetic flux penetrating through the closed loop. Therefore, in the vicinity of the closed loop portion of the member formed of the conductive material, a gradient magnetic field controlled with high degree of accuracy required for encoding a space coordinate of the magnetic resonance imaging apparatus may be disturbed.

Secondly, according to Maxwell-Ampere' rule low, when the member formed of the conductive material has a closed loop portion forming a closed loop, an induced electromotive force is caused by temporal variation of all the magnetic fluxes penetrating through the closed loop. Since an electromagnetic wave caused by a variation current flowing in the closed loop is generated by the induced electromotive force, the member having the closed loop portion formed of the conductive material may be a noise generating source with respect to the magnetic resonance imaging apparatus and other peripheral apparatuses.

Thirdly, in the member having a closed loop portion formed of the conductive material and forming a closed loop, when a magnetic flux penetrating through the closed loop temporally varies, a temporally varying current flows in the closed loop by an induced electromotive force. Therefore, temporally varying Lorenz Force is applied on the closed loop portion formed of the conductive material in the direction of a vector product I×B, where I is a current vector, and B is a magnetic flux vector. The Lorentz force causes an unnecessary mechanical vibration. Therefore, a member having a closed loop portion formed of the conductive material may affect on a performance of the vibration type drive device.

One aspect of the present disclosure is related to a vibration type drive device which affects less on a diagnosis, measurement, and medical treatment even though being used in the vicinity or in the interior of a magnetic field when performing the diagnosis, the measurement, and the medical treatment using the magnetic field in a space. For example, one aspect of the present disclosure is related to a vibration type drive device which is configured to less affect the magnetic resonance imaging apparatus and other peripheral apparatuses even when being installed in the vicinity or in the interior of a gantry of the magnetic resonance imaging apparatus. Another aspect of the present disclosure is related to a medical apparatus or a medical system having the vibration type drive device described above.

One aspect of the disclosure is related to a vibration type drive device including: a mechanical energy application element; a resilient member provided with the mechanical energy application element; a driven member subjected to a relative displacement with respect to the resilient member due to a vibration excited by the resilient member, wherein at least one of the resilient member and the driven member includes a portion formed of a conductive material, and a portion formed of the conductive material has an ended arcuate shape.

Further features of the invention will become apparent from the following description of exemplary embodiments with reference to the attached drawings.

DESCRIPTION OF THE EMBODIMENTS

Figure 1:
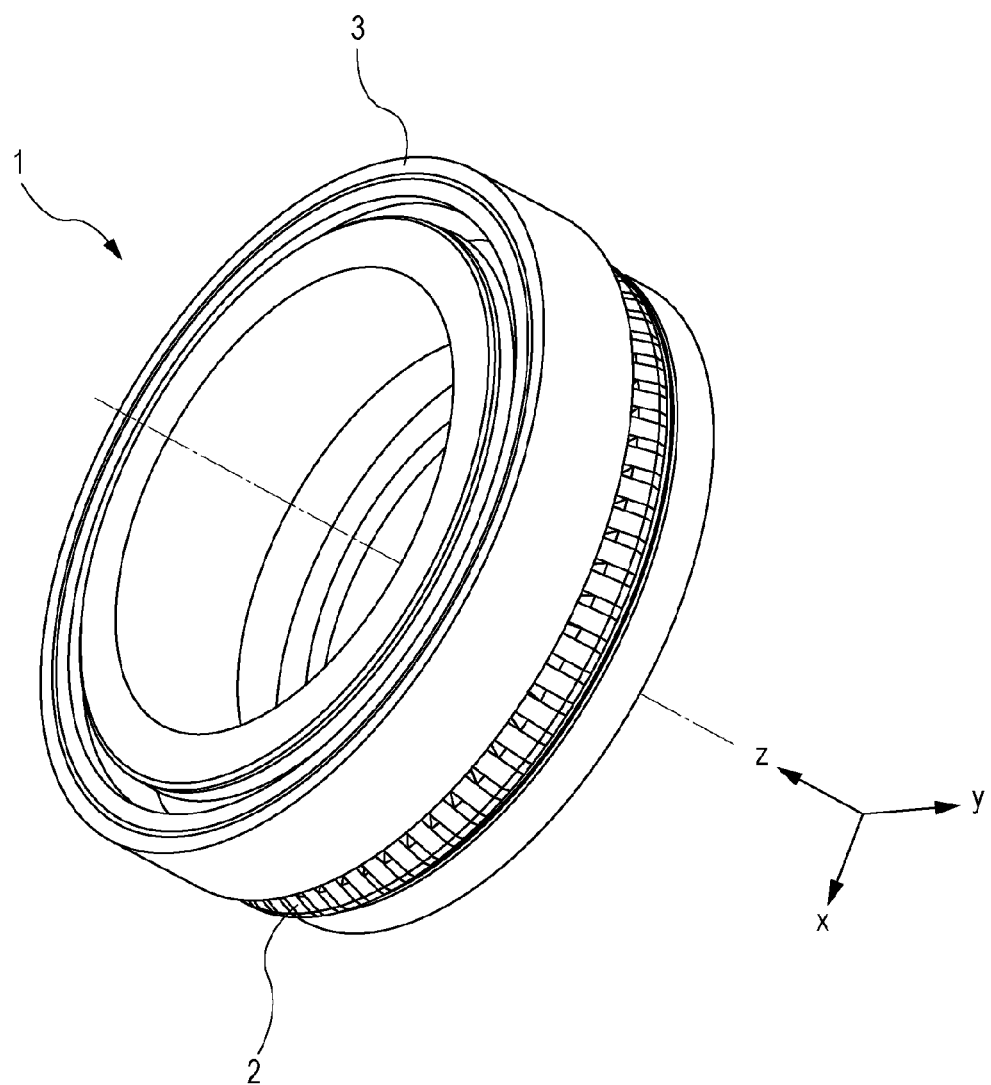
FIG. 1 is a schematic perspective view of a vibration type drive device.

Embodiments of the invention will be described below.

A first aspect of the present disclosure relates to a vibration type drive device including: a mechanical energy application element; a resilient member provided with the mechanical energy application element; and a driven member subjected to a relative displacement with respect to the resilient member due to a vibration excited by the resilient member, wherein the resilient member includes a conductive material, and does not constitute an electric closed loop.

A second aspect of the disclosure relates to a medical apparatus including: a medical instrument; a holding portion configured to hold the medical instrument; and a vibration type drive device mounted on the holding portion, wherein the vibration type drive device includes: a mechanical energy application element; a resilient member provided with the mechanical energy application element; and a driven member subjected to a relative displacement with respect to the resilient member due to a vibration excited by the resilient member, wherein the driven member includes a conductive material, and does not constitute an electric closed loop.

In addition, a third aspect of the disclosure relates to a medical apparatus including: a medical instrument; a holding portion configured to hold the medical instrument; and a vibration type drive device mounted on the holding portion, the vibration type drive device including: a mechanical energy application element; a resilient member provided with the mechanical energy application element; and a driven member subjected to a relative displacement with respect to the resilient member due to a vibration excited by the resilient member, wherein the driven member includes a conductive material, and does not constitute an electric closed loop.

In addition, a fourth aspect of the disclosure relates to a medical apparatus including: a medical apparatus including a medical instrument; a holding portion configured to hold the medical instrument; and a vibration type drive device mounted on the holding portion according to an aspect of the invention, and also to a medical system including the medical apparatus provided within the magnetic resonance imaging apparatus.

The term "driven member" indicates a member subjected to a relative displacement with respect to the resilient member as a result of the vibration of the resilient member. The expression "subjected to a relative displacement between the resilient member and the driven member" includes a case where both of the resilient member and the driven member are moved, a case where the resilient member is fixed and the driven member is moved, and a case where the driven member is fixed and the resilient member is moved.

In the specification the term "arcuate shape" means part of a circumference. The term "circle" here includes not only a perfect circle, but also an oval and a circle whose radius of curvature changes discontinuously. The term "ended arcuate shape" means an arcuate shape having an end portion, that is, a closed loop shape such as a circle having no end portion is not included.

Examples of embodiments of the vibration type drive device of the disclosure will be described from Embodiments 1 to 5. In the respective embodiments, when one of components thereof includes a conductive material, detailed examples of configuration which constitute the member so as not to include a closed loop formed of the conductive material (electric closed loop) are described. However, the invention is not limited thereto, and the vibration type drive device may be configured by combining materials or configurations of the component members disclosed in the respective embodiments.

Also, an example of a medical apparatus using the vibration type drive device disclosed in Embodiments 1 to 5, or a vibration type drive device configured by combining components disclosed in Embodiments 1 to 5 will be described in Embodiment 6.

Embodiment 1

Referring now to FIG. 1 to FIG. 4B, a first embodiment of the disclosure will be described. Coordinate axes illustrated in the drawings are common.

Figure 2:
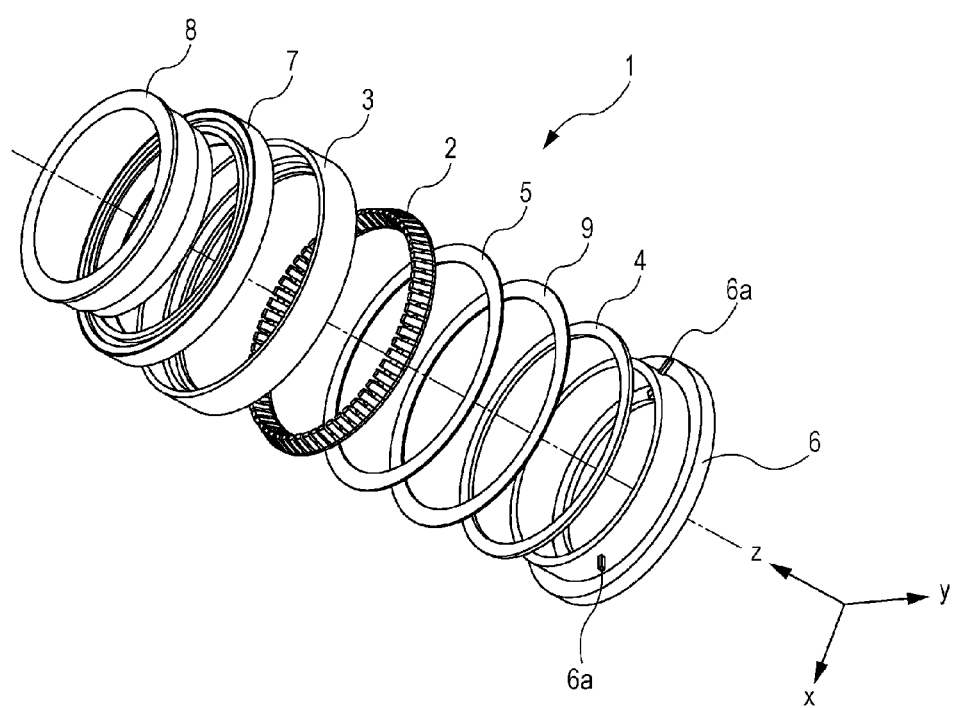
FIG. 2 is a schematic perspective view of the vibration type drive device illustrated in a three-dimensionally disassembled manner.
Figure 3A:
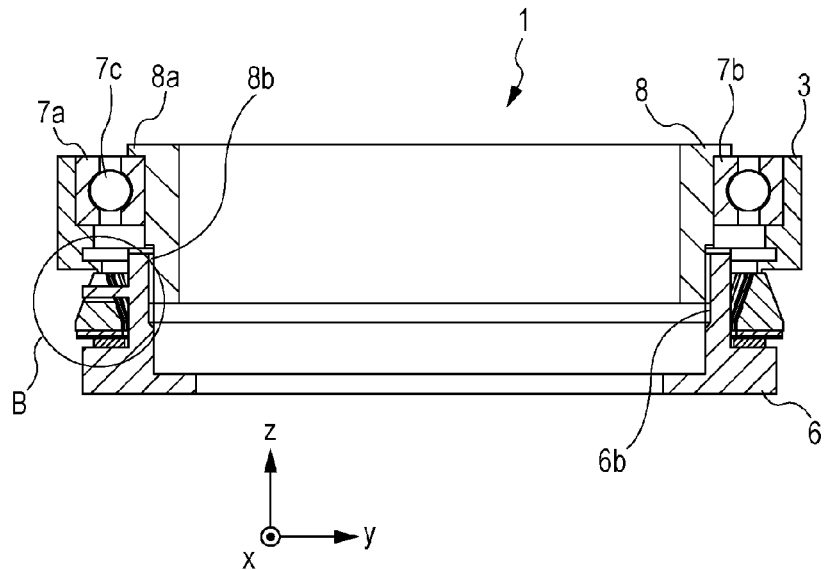
FIG. 3A is a schematic cross-sectional view of the vibration type drive device.
Figure 3B:
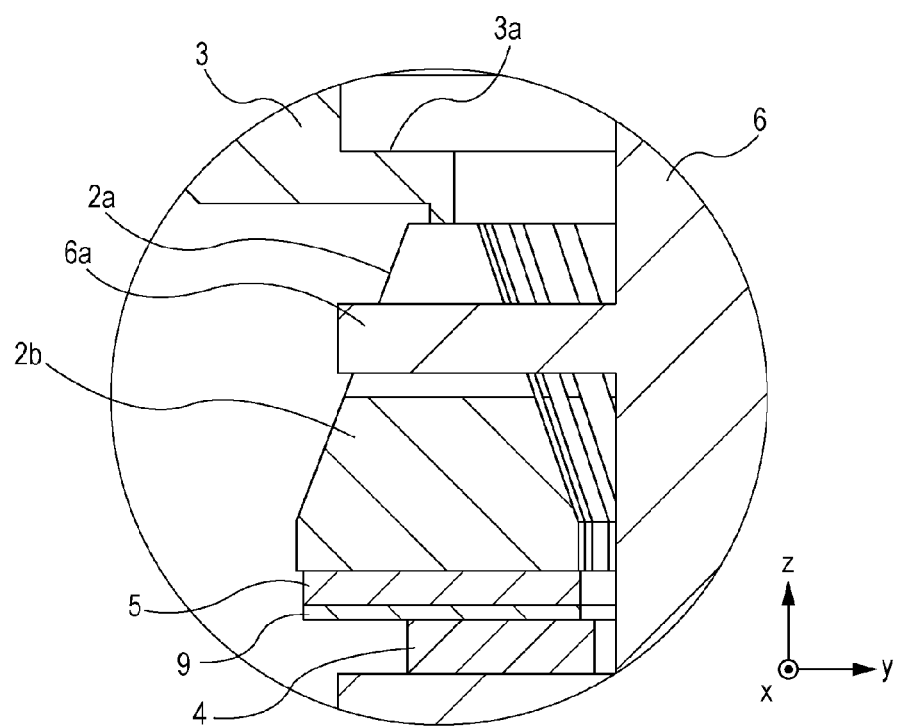
FIG. 3B is an enlarged view of a portion B of FIG. 3A.

FIG. 1 is a schematic perspective view of a vibration type drive device 1 according to the first embodiment of the disclosure. A schematic perspective view illustrating the vibration type drive device 1 in FIG. 1 disassembled three-dimensionally is illustrated in FIG. 2. A schematic cross-sectional view taken along a cross section y-z passing through a center axis of the vibration type drive device 1 in FIG. 1 viewed in a positive direction of an x-axis is illustrated in FIG. 3A. An enlarged detailed drawing of a circled portion B in FIG. 3A is illustrated in FIG. 3B. In FIGS. 3A and 3B, the cross section is illustrated by hatching.

First of all, a structure and an operation principle of the vibration type drive device 1 will be described. Reference numeral 2 denotes a resilient member, and a mechanical energy application element is provided on a back surface thereof. For example, a piezoelectric element 5 is secured to the back surface of the resilient member 2 as a mechanical energy application element. When an electric signal is transmitted to the piezoelectric element 5 by an electric substrate 9, the piezoelectric element 5 converts an electric energy to a mechanical energy, and causes a displacement in an axial direction. By polarizing the piezoelectric element 5 into a plurality of poles and exciting a natural vibration which matches a bending vibration mode of the resilient member 2, the displacement in the axial direction and a displacement in a driving direction orthogonal thereto may be obtained on an upper end surface of the resilient member 2. Since the resilient member 2 is formed with a plurality of grooves in a radial direction as illustrated in the drawings, a larger displacement may be obtained efficiently with a smaller energy. A driven member 3 includes a resilient member 3a, and follows the displacement of the resilient member 2 in the axial direction, and hence constitutes a mechanism which is capable of taking out the displacement in the driving direction efficiently from the displacement of the resilient member 2 at an upper end thereof. Here, the example in which the piezoelectric element is used as the mechanical energy application element is described. However, the mechanical energy application element is not limited thereto. For example, a mechanical energy generating unit using a magnetostrictive effect may be used. Also, the mechanical energy generating unit is not limited to those converting electric energy or magnetic energy into mechanical energy, and may be those converting energy of fluid or heat into the mechanical energy. The piezoelectric element is an example of an electro-mechanical energy converting element.

Subsequently, a supporting mechanism in the vibration type drive device 1 will be described. The resilient member 2 is supported by a first supporting member 6. The first supporting member 6 includes holding mechanisms 6a at every 120° intervals in the radial direction and, as illustrated in FIG. 3B, the resilient member 2 is constrained and supported in the radial direction by the holding mechanisms 6a being fitted into the grooves of the resilient member 2. A unit including the electric substrate 9, the piezoelectric element 5, and the resilient member 2 integrated is held on a nonwoven fabric 4 arranged on the first supporting member 6. In FIG. 3B, the holding mechanisms 6a are illustrated as part of the first supporting member 6. However, the first supporting member 6 may be composed of two or more members such as forming the first supporting member 6 and the holding mechanisms 6a as separate members considering easiness of assembly of the resilient member 2 into the first supporting member 6.

Subsequently, a method of supporting the driven member 3 will be described. Reference numeral 7 is a second supporting member configured to support the driven member 3. The second supporting member 7 is a radial ball bearing composed of an outer wheel 7a, an inner wheel 7b, and a plurality of balls 7c. The driven member 3 and the second supporting member 7 are supported by fitting of the outer diameter of the outer wheel 7a. An upper end portion of the inner wheel 7b and a resilient portion 8a of the pressurizing member 8 are in a contact state, and the resilient portion 8a is resiliently deformed by tightening a male screw 8b provided on an outer periphery of the pressurizing member 8 and a female screw 6b provided on an inner periphery of the first supporting member 6. The pressurizing member 8 is a member for applying a contact pressure between the driven member 3 and the resilient member 2, and has a configuration capable of pressurizing at an adequate load in the axial direction by using the resilient deformation of the pressurizing member 8. In this manner, by pressurizing the driven member 3 toward the resilient member 2 at the adequate load, preferable friction characteristics suitable for driving may be obtained.

As described above, when using the vibration type drive device in a space in which a magnetic field is generated, if the member composed of the conductive material has the closed-loop portion, the diagnosis, the measurement, the medical performance, or the like may be affected by a current flowing in the closed loop portion. Therefore, in this embodiment, when the resilient member 2 includes the conductive material, a configuration in which the resilient member 2 does not have an electric closed loop is employed.

In this embodiment, a case where the vibration type drive device is used in the vicinity or in the interior of the magnetic resonance imaging apparatus will be described.

Figure 4A:
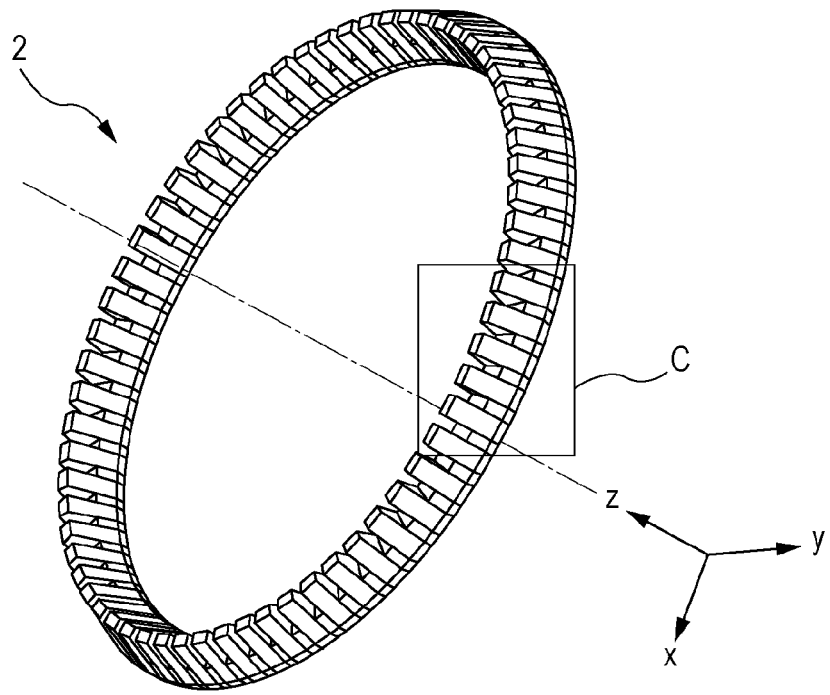
FIG. 4A is a schematic perspective view of a resilient member.
Figure 4B:
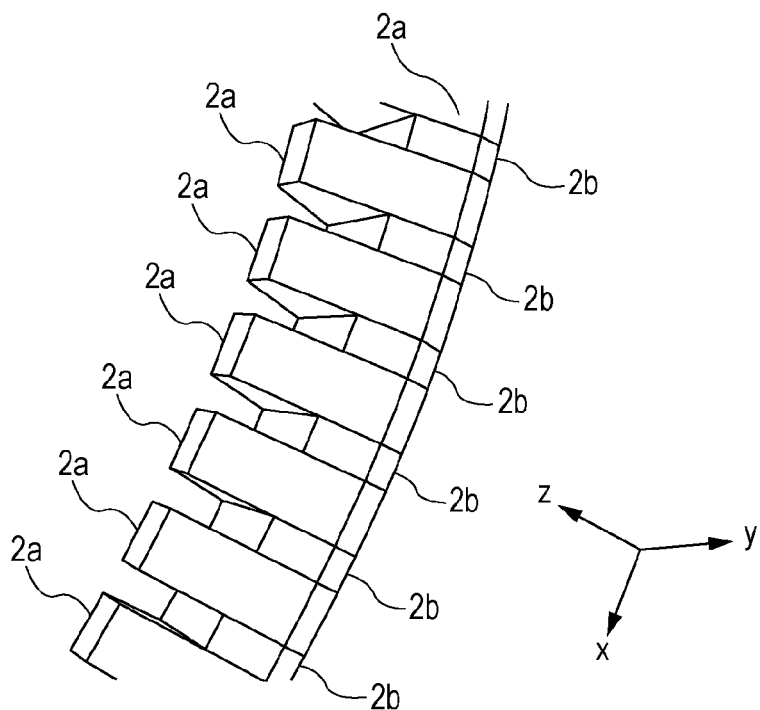
FIG. 4B is an enlarged view of a portion C of FIG. 4A.

FIG. 4A illustrates a schematic perspective view of the resilient member 2, and an enlarged detailed drawing of a portion C surrounded by a rectangular shape will be illustrated in FIG. 4B. The resilient member 2 forms a ring-shaped closed loop by cyclical joint between first resilient elements 2a and second resilient elements 2b. The resilient member 2 has a structure having the plurality of grooves in the circumferential direction by the difference in dimension in a z-axis direction of the first resilient elements 2a and the second resilient elements 2b. First of all, a material of the resilient member 2 will be described. The first resilient elements 2a are formed of a non-magnetic metal having low magnetic susceptibility such as beryllium copper or phosphor bronze having relatively a high density in order to transmit sufficient vibration energy to the driven member 3. In contrast, the second resilient elements 2b are formed of a non-conductive material in order to disconnect the closed loop having the conductivity of the resilient member 2. As the second resilient elements 2b, application of a fiber reinforced plastic (FRP) such as polyether ether ketone (PEEK) containing glass fiber (GF) as filler is considered in this embodiment. In a case where the conductive material such as metal is applied to the first resilient elements 2a and the non-conductive material is applied to the second resilient elements 2b as in this embodiment, the number of natural vibrations which matches the drive frequency of the driven member 3 needs to be designed to be sufficiently higher than the number of natural vibrations which matches the drive frequency of the resilient member 2 in order to obtain a desirable controllability of the vibration type drive device 1. As a specific unit configured to adjust the natural frequency which matches the drive frequency of the resilient member 2, adjustment of the ratio of composition of the filler with respect to the second resilient elements 2b or adjustment of the depth in the circumferential direction are exemplified. Obtaining adequate friction characteristics with respect to the driven member 3 or applying surface treatment such as electrodeless nickel-phosphorous (Ni—P) plate in advance for suppressing generation of abrasion powder of beryllium copper are also effective.

As a method of manufacturing the resilient member 2, a member obtained by securing the first resilient elements 2a and the second resilient elements 2b with each other may be secured to the piezoelectric element 5. However, in this embodiment, application of an in-mold forming technique is considered. The first resilient elements 2a are set circumferentially in a die in advance, and a circumferential clearance is filled with the fiber reinforced plastic (FRP) as the second resilient elements 2b by a molding machine, so that improvement of productivity is achieved.

A resilient member 22 includes the second resilient elements 2b as members formed of a conductive material. However, the second resilient elements 2b have an ended arcuate shape. Therefore, the resilient member 22 may be configured not to have a closed loop formed of the conductive material.

Subsequently, a material of the driven member 3 and a method of manufacturing the same may be described. The driven member needs to have stable resilient characteristics in the z-axis direction in the drawings as described above. Also, in order to obtain preferable control characteristics of the vibration type drive device, the number of natural vibrations of the driven member in the vibration mode which follows the bending vibration of the resilient member needs to be sufficiently higher than the number of natural vibration of the bending vibrations of the resilient member. In view of above-described two points, in this embodiment, the driven member 3 is formed of fiber reinforced plastic (FRP) obtained by adding filler such as glass fiber (GF) to the polyether ether ketone. The glass fiber (GF) added as the filler acts as a hard abrasion-resistant material, and also contributes to securement of a stable friction force. In addition, in order to improve a sliding property, a fluorine-type resin such as polytetrafluoroethylene (PTFE) or a heat resistant resin such as polyimide (PI) may be contained. Also, in order to improve the friction force, non-oxide ceramics such as silicon carbide (SiC) or titanium carbide (TiC) may be contained in ceramics or a resin material. A coating film of a non-metallic material such as diamond-like carbon (DLC) or non-oxide such as the silicon carbide (SiC) or the titanium carbide (TiC) may be formed as a surface layer of a contact member. When a driven member is formed by using fiber reinforced plastic normally available on the market, it is normal to manufacture the same by cutting work or injection molding. When the ring-shaped driven member illustrated in the drawing is manufactured by the above-described cutting work, a bar member formed of an FRP available on the market is generally used for the work. However, since many of the bar members are manufactured by extrusion molding, orientation of the filler is aligned with the direction of extrusion, so that anisotropy of the rigidity may result. In addition, the density of the filler varies in the radial direction, and hence a characteristic error with respect to the design may easily occur. When manufacturing the ring-shaped driven member by injection molding, uneven dispersion originating from a gate of the die may easily occur, and the anisotropy of the rigidity may occur easily in the same manner. Therefore, in this embodiment, the driven member may be manufactured according to the following procedure. First of all, granular resin and fibers of the filler are mixed evenly in advance and is filled in the cylindrical die to apply compression molding while heating, and a cylindrical (disc-shaped) blank material having dimensions larger than the driven member is molded. Subsequently, the blank material manufactured by compression molding is finished to have a predetermined dimension by machining work such as lathe work. In this procedure, the filler in the fiber reinforced plastic may be dispersed uniformly, and the resilient characteristics of the resilient member 3a may be designed with high degree of accuracy. As a design example, a case of providing the resilient member 3a with a resilient function equivalent to that in a case where aluminum-based metal such as A5056 used as the driven member in the related art is considered. Polyether ether ketone (PEEK) containing glass fiber by 30 [%] added therein has a Young's modulus of approximately 14 [%] of aluminum-based metal A5056. When PEEK containing the glass fiber added thereto is used as the material of the driven member, resilient characteristics equivalent to that of A5056 may be obtained by designing the thickness of the resilient member 3a in the z-axis direction adequately according to the drive frequency. In this manner, by dispersing the filler uniformly, an effect of improving the accuracy of the resilient characteristics is expected. Also, an effect of increasing creep time is expected by adding the filler. In this embodiment, an example of manufacture in which a member formed by mixing a granular resin and filler in advance and compression-molding the same is used as a blank material has been described. However, even when such a method can hardly be applied, the anisotropy of the fiber reinforced plastic (FRP) containing the filler added therein may easily be simplified. In other words, a bar material, a tube material, or other materials available on the market are put in the die for molding the blank and compression molding is performed slowly while heating, whereby an effect of dispersing the aligned orientation of the filling agent is expected.

Subsequently, a material of the pressurizing member 8 will be described. The pressurizing member 8 of this embodiment includes the resilient portion 8a, and the resilient characteristics thereof are used for managing a precompression of the second supporting member 7 and the contact pressure between the resilient member 2 and the driven member 3, so that the resilient portion 8a is required to have resilient characteristics with high degree of accuracy. By forming the pressurizing member 8 using engineering plastic, the resilient characteristics including less anisotropy are obtained. Furthermore, in the same manner as the driven member 3, when the fiber reinforced plastic (FRP) containing the filler added thereto is used, preferable creep characteristics are obtained.

Subsequently, materials of the piezoelectric element 5, the first supporting member 6, and the second supporting member 7 will be described. The piezoelectric element 5 may be formed of, for example, ceramics, and a piezoelectric element containing lead zirconate titanate ($PbZrO_3$—$PbTiO_3$) as principal components may be used. Also, since the first supporting member 6 is not required to have the resilient characteristics with high degree of accuracy or high heat resistance, non-conductive materials such as engineering plastic, machineable ceramics, fine ceramics, and the like may be used for forming the same. The outer wheel 7a and the inner wheel 7b of the second supporting member 7 may be formed of the non-conductive materials such as engineering plastic, machineable ceramics, and fine ceramics. The balls 7c may be formed of ceramics, and if forming by using a partially stabilized zirconia (PSZ) having a high toughness for example, the balls 7c superior in toughness, heat resistance, and abrasion resistance may be formed.

Finally, materials and configurations of the nonwoven fabric 4 and the electric substrate 9 will be described. The nonwoven fabric 4 may be formed of felt created with polyester or polyurethane (PUR) or the like as raw materials. Also, felt created with wool or the like may be used therefor. As the electric substrate 9, for example, a flexible substrate manufactured by forming a bonding layer may be formed on a base film formed of a resin, forming a conductive film such as copper foil via the bonding layer, and protecting portions other than a terminal portion with an insulating layer such as a resin may be used. As the resin forming the base film or the insulating film, for example, Polyimide (PI) may be used.

According to this embodiment, the vibration type drive device which does not include the closed loop formed of the conductive material on the electric substrate and members other than the electrodes provided on the piezoelectric element may be provided. Therefore, by using the vibration type drive device of this embodiment, even when being used in the vicinity or in the interior of the magnetic resonance imaging apparatus, an effect of reducing the noise with respect to the magnetic resonance imaging apparatus is expected. Generation of unnecessary mechanical vibrations may be reduced.

The members of the vibration type drive device 1 of the disclosure is not limited to the above-described material, as long as the material or the design which does not include the closed loop formed of the conductive material is applied to the respective members. In this embodiment, an example in which the non-magnetic metallic material having a low magnetic susceptibility such as beryllium copper or phosphor bronze is used as the first resilient elements 2a has been described. However, other metallic materials may also be used, and the non-metallic conductive materials may also be used. For example, application of fiber reinforced plastic (FRP) containing conductive carbon fiber (CF) as filler is conceivable as the first resilient elements 2a in order to improve an adequate rigidity and slidability with respect to the driven member 3. In contrast, application of the non-conductive material to the first resilient elements 2a and the conductive material to the second resilient elements 2b is also possible. A case where the second resilient elements 2b are not provided and a plurality of first resilient elements 2a are arranged in the circumferential direction with the provision of spaces between the adjacent first resilient elements 2a, and are directly secured to the piezoelectric element 5 is also included in the scope of the disclosure. Furthermore, the resilient elements 2a and 2b do not necessarily have to have the same shape and be arranged on the circumference equidistantly, and the dimensions of the resilient elements and the depths of the grooves may be different from each other depending on the position in the circumferential direction.

In this embodiment, the embodiment relating to the vibration type drive device of a ring-shaped rotation driving type has been described. However, the vibration type drive device of the disclosure is not limited thereto. The invention is also applicable to a vibration type drive device of a direct operated driving type as described in Japanese Patent Laid-Open No. 2004-304887. The concepts disclosed herein are further applicable to a solid rotational type drive system, and a vibration type drive devices of an in-plane driving type and a spherical driving type.

Embodiment 2

Referring now to FIG. 5 to FIG. 7B, a second embodiment of the disclosure will be described. Coordinate axes illustrated in the drawings are common. The description of portion common to Embodiment 1 is omitted, and the common part will be described by using the same reference numeral.

Figure 5:
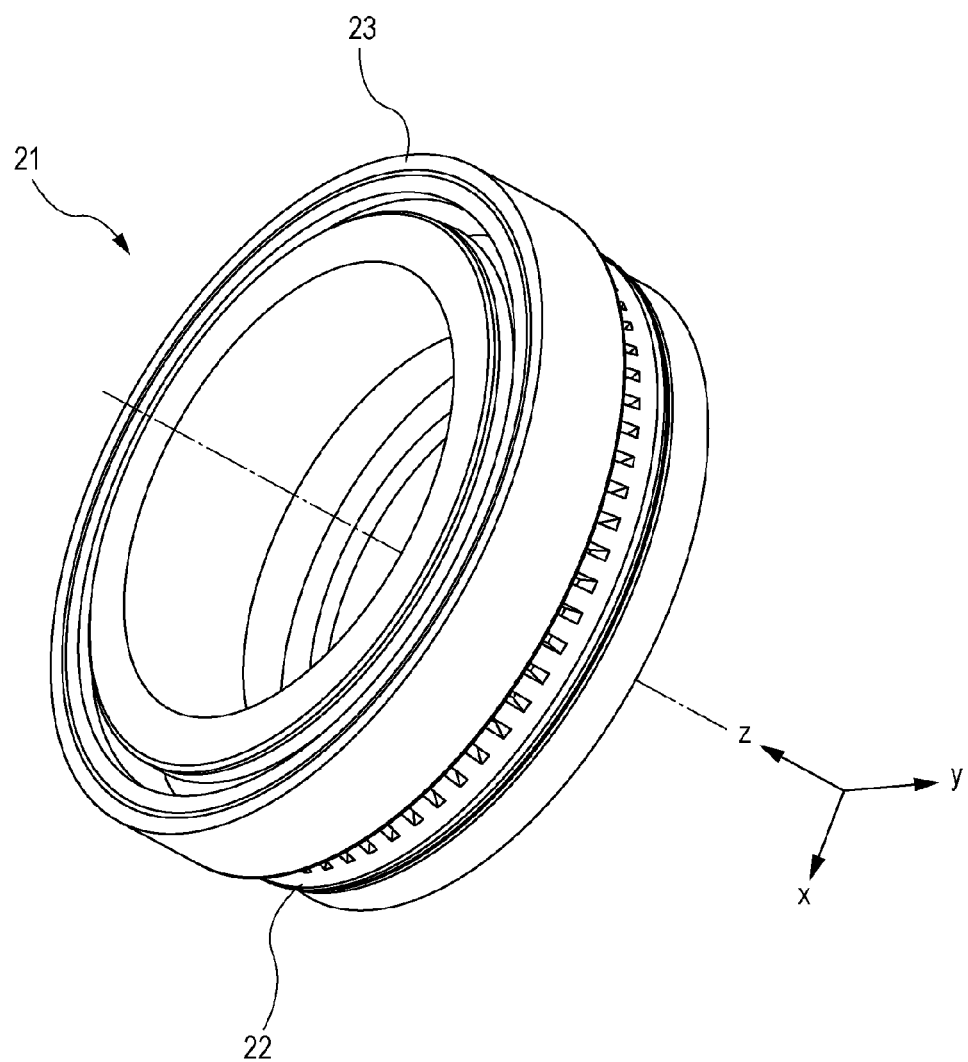
FIG. 5 is a schematic perspective view of a vibration type drive device.
Figure 6:
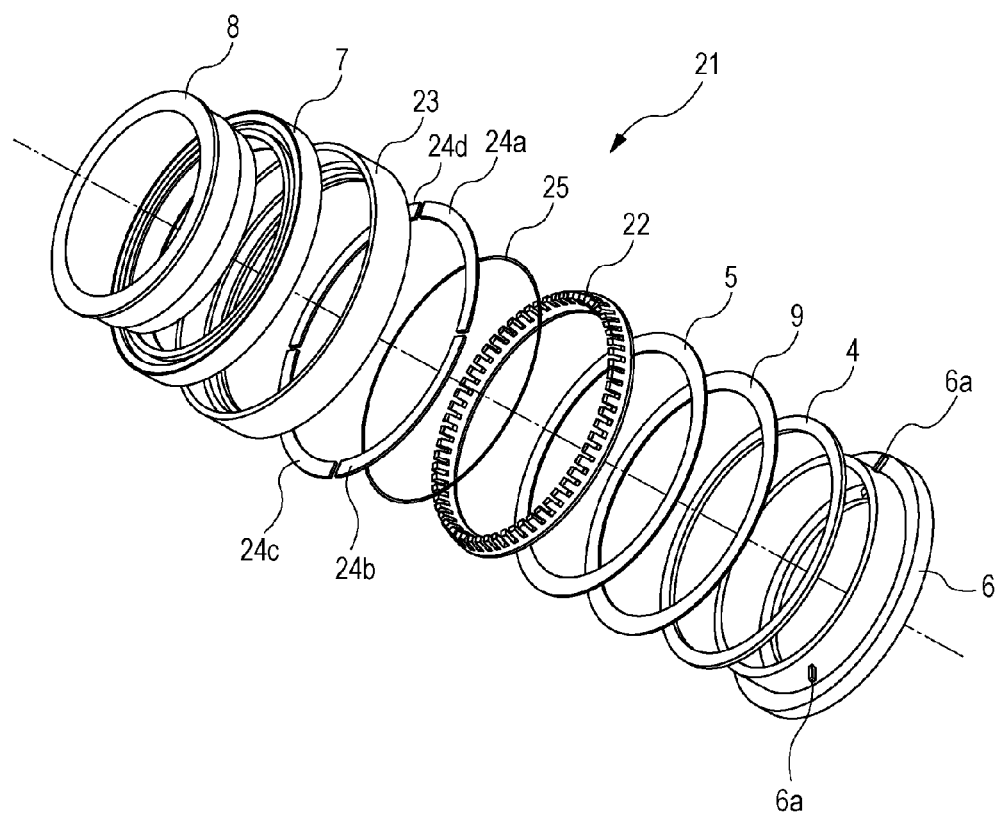
FIG. 6 is a schematic perspective view of the vibration type drive device illustrated in a three-dimensionally disassembled manner.
Figure 7A:
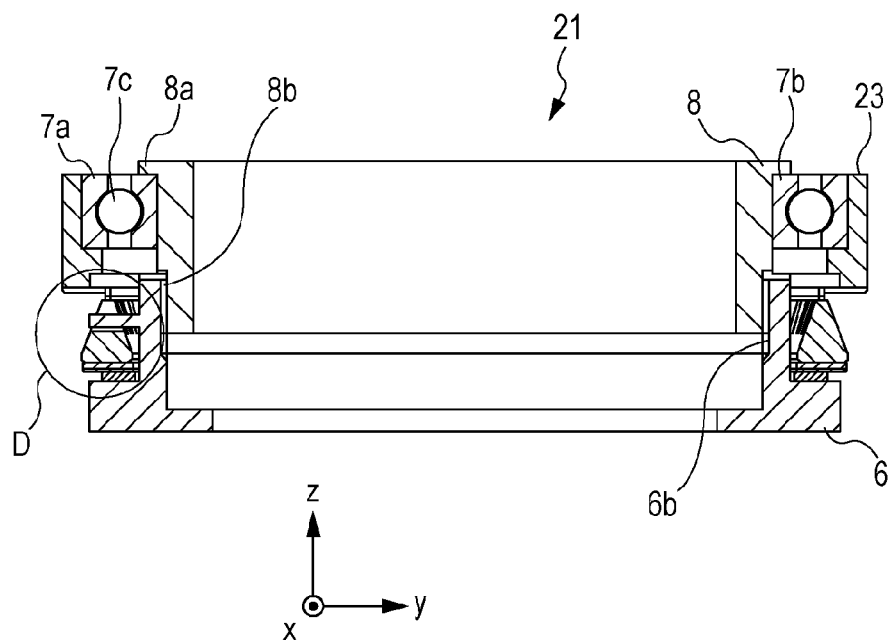
FIG. 7A is a schematic cross-sectional view of the vibration type drive device.
Figure 7B:
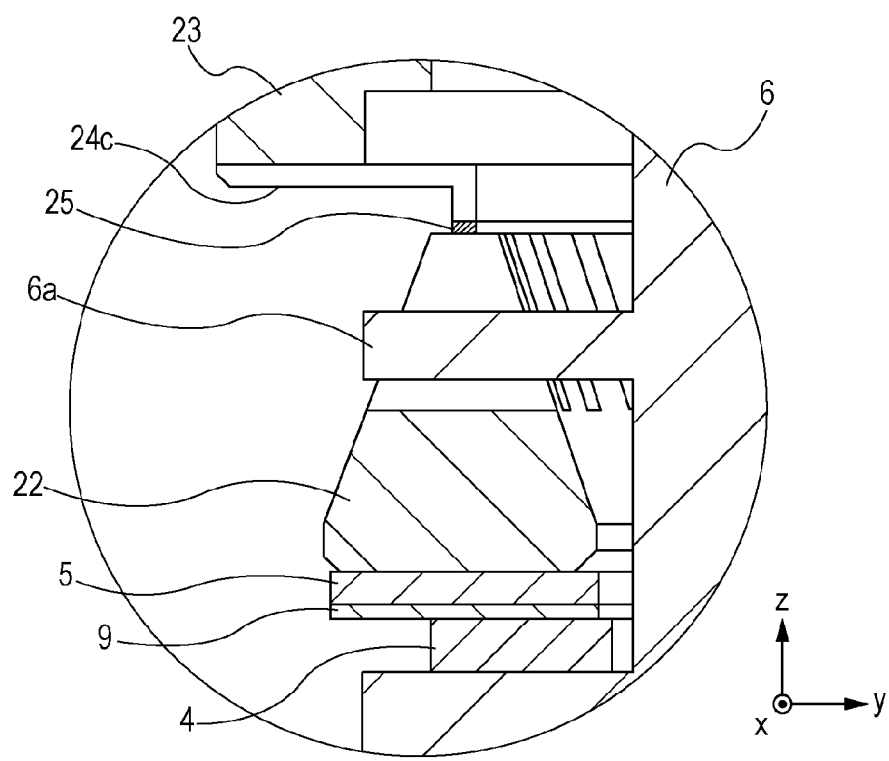
FIG. 7B is an enlarged view of a portion D of FIG. 7A.

FIG. 5 is a schematic perspective view of a vibration type drive device 21 in the second embodiment of the disclosure. A schematic perspective view illustrating the vibration type drive device 21 in FIG. 5 in a three-dimensionally disassembled manner is illustrated in FIG. 6. A schematic cross-sectional view taken along a cross section y-z passing through a center axis of the vibration type drive device 21 in FIG. 5 viewed in a positive direction of an x-axis is illustrated in FIG. 7A. An enlarged detailed drawing of a circled portion D in FIG. 7A is illustrated in FIG. 7B. In FIGS. 7A and 7B, the cross section is illustrated by hatching.

First of all, a structure and an operation principle of the vibration type drive device 21 will be described. Reference numeral 22 denotes the resilient member, and a mechanical energy application element is provided on a back surface thereof. For example, the piezoelectric element 5 is secured to the back surface of the resilient member 22. In the same manner as the Embodiment 1, by exciting a natural vibration which matches a vibration mode in the radial bending direction of the resilient member 22, displacements in the axial direction and in the circumferential direction orthogonal thereto may be obtained on an upper end surface of the resilient member 22.

In this embodiment, the driven member includes a driven member body 23 and contact resilient members 24a to 24d. The driven member body 23 and the contact resilient members 24a to 24d are driven by the resilient member 22 via the contact member 25. As illustrated in FIG. 6 and FIG. 7B, the four contact resilient members 24a to 24d do not come into contact with each other, and upper ends thereof are adhered to the driven member body 23 respectively. Therefore, spaces are provided between the adjacent contact resilient members 24a to 24d. It is also possible to fill clearances with a non-conductive resin material or the like instead of providing the spaces. The ring-shaped contact member 25 is secured to lower ends of the contact resilient members 24a to 24d. The contact resilient members 24a to 24d act as resilient elements in the axial direction and follow the axial displacement of the resilient member 22, and hence constitute a mechanism which is capable of taking out a displacement in the driving direction (circumferential direction here) efficiently from the displacement of the resilient member 23 at an upper end thereof in the same manner as the resilient member 3a of Embodiment 1.

Subsequently, a supporting mechanism in the vibration type drive device 21 will be described. The resilient member 22 is supported by the first supporting member 6, the driven member body 23 is supported by the second supporting member 7, and a supporting method is the same as that of Embodiment 1.

In the vibration type drive device 21 of this embodiment as well, selection of material and designing of the member are performed so that the conductive material does not form a closed loop in the same manner as Embodiment 1.

First of all, materials of the driven member body 23, the contact resilient members 24a to 24d and the contact member 25 will be described. In this embodiment, application of alumina ($Al_2O_3$) as the driven member body 23 is checked up. Subsequently, as the contact resilient members 24a to 24d, for example, metals being subjected to less attenuation of vibration may be used. Accordingly, the resilient characteristics with high degree of accuracy may be realized in the axial direction without depending on the driving frequency of the vibration type drive device. Also, in view of influence on the magnetic field, non-magnetic metallic materials having a relatively low magnetic susceptibility such as beryllium copper or phosphor bronze may be applied among other metals. Here, the contact resilient members 24a to 24d are formed respectively of the conductive material, and the shape thereof is an ended arcuate shape. Therefore, the contact resilient members 24a to 24d have a configuration having no closed loop formed of the conductive material.

The contact member 25 may be formed by using fluorine-type resin such as polytetrafluoroethylene (PTFE) or a heat resistant resin such as polyimide (PI) in order to improve the sliding property. In order to secure a stable frictional force, glass fiber (GF) or the like may be contained as a hard abrasion-resistant material. Also, in order to improve the friction force, non-oxide ceramics such as silicon carbide (SiC), or titanium carbide (TiC) may be contained in ceramics or a resin material. A coating film of a non-metallic material such as diamond-like carbon (DLC) or non-oxide such as the silicon carbide (SiC) or the titanium carbide (TiC) may be formed as a surface layer of the contact member.

Subsequently, a material of the resilient member 22 will be described. In this embodiment, partially stabilized zirconia (PSZ) obtained by dispersing and precipitating partially tetragonal system in a tetragonal crystal and sintering by a hot isostatic pressure sintering method (HIP) is used as a resilient member. The stabilized zirconia (SZ) is used as a heat resistant material. The stabilized zirconia maintains the cubical crystal even in a low-temperature state by solid solution of magnesium oxide (MgO), yttria ($Y_2O_3$), calcium oxide (CaO) and the like in the zirconia ($ZrO_2$). In contrast, in Partial Stabilized Zirconia (PSZ), the tetragonal crystal is contained as quasi-stable phase. Therefore, at least one of magnesium oxide (MgO) and yttria ($Y_2O_3$) is added by an amount smaller than an amount required for stabilizing zirconia ($ZrO_2$) as stabilized zirconia (SZ), and an adequate heat treatment is performed. Accordingly, zirconia may be partially stabilized. In order to increase strength, solid solution of alumina ($Al_2O_3$) may be performed. By employing partially stabilized zirconia, breakdown energy of a cracked distal end of an applied field is absorbed by martensitic transformation from the tetragonal crystal to a monoclinic crystal, and hence a high toughness may be advantageously obtained even by fine ceramics. Partially stabilized zirconia (PSZ) has a specific gravity on the order of approximately 79[%] of martensitic system stainless steel SUS420J2, which is a higher specific gravity in comparison with ceramics material such as a resin or alumina ($Al_2O_3$). Therefore, by forming the resilient member 22 by using partially stabilized zirconia (PSZ), larger oscillation energy in comparison with other fine ceramics may be obtained, and since a viscosity loss is smaller than a resin, preferable vibration characteristics may be obtained in comparison with other non-conductive materials.

The nonwoven fabric 4, the piezoelectric element 5, the first supporting member 6, the second supporting member 7, the pressurizing member 8, and the electric substrate 9 of this embodiment may be formed of, for example, the same materials and structures as those of Embodiment 1, so that detailed description will be omitted.

According to this embodiment, the vibration type drive device which does not include the closed loop formed of the conductive material on the electric substrate and the members other than the electrodes provided on the piezoelectric element may be provided. Therefore, even when the vibration type drive device is used, for example, in the vicinity or in the interior of the magnetic resonance imaging apparatus, an effect of reducing the noise with respect to the magnetic resonance imaging apparatus is expected. Generation of unnecessary mechanical vibrations may be reduced. Furthermore, this embodiment shows an example of forming the resilient member 22 by using partially stabilized zirconia (PSZ) and the driven member body 23 with alumina ($Al_2O_3$). In general, since alumina ($Al_2O_3$) has a smaller specific gravity and higher Young's modulus in comparison with a partially stabilized zirconia (PSZ), the natural frequency which matches the driving frequency of a main body of the driven member may be set to a sufficiently high value. Therefore, a preferable controllability of the driven member may be secured.

The vibration type drive device 21 of the disclosure is not limited to the above-described material, as long as the material or the design which does not include the closed loop formed of the conductive material is applied to the respective members. In this embodiment, an example in which the metallic material is used as the contact resilient members 24a to 24d has been described. However, other metallic materials may also be used, and the non-metallic conductive materials may also be used. Furthermore, the following design may be employed without providing the contact member 25. For example, application of fiber reinforced plastic (FRP) containing conductive carbon fiber (CF) as the filler is also conceivable in order to provide an adequate rigidity and an improved slidability with respect to the driven member 22 as the contact resilient members 24a to 24d. In this case, the glass fiber (GF) and carbon fiber (CF) added as the filler act as a hard abrasion-resistant material, and also contribute to securement of a stable friction force. In addition, in order to improve the sliding property, a fluorine-type resin such as polytetrafluoroethylene (PTFE) or a heat resistant resin such as polyimide (PI) may be contained. Also, in order to improve the friction force, non-oxide ceramics such as silicon carbide (SiC) or titanium carbide (TiC) may be contained in ceramics or a resin material. A coating film of a non-metallic material such as diamond-like carbon (DLC) or non-oxide such as the silicon carbide (SiC) or the titanium carbide (TiC) may be formed as a surface layer of the contact member. Also, the contact resilient members 24a to 24d do not have to include four members arranged equidistantly on the circumference, and may be formed integrally into a C-shape, for example, as long as the closed loop having the conductivity is not formed. The same surface treatment may be performed on a surface layer of the resilient member 22.

In this embodiment, the embodiment relating to the vibration type drive device of a ring-shaped rotation driving type has been described. However, the vibration type drive device of the disclosure is not limited thereto. The disclosure is further applicable to a solid rotational type drive system, and vibration type drive devices of a direct operated driving type, an in-plane driving type, and a spherical driving type.

Embodiment 3

Referring now to FIG. 8 to FIG. 10B, a third embodiment of the disclosure will be described. Coordinate axes illustrated in the drawings are common. The description of portion common to Embodiments 1 and 2 is omitted, and the common part will be described by using the same reference numeral.

Figure 8:
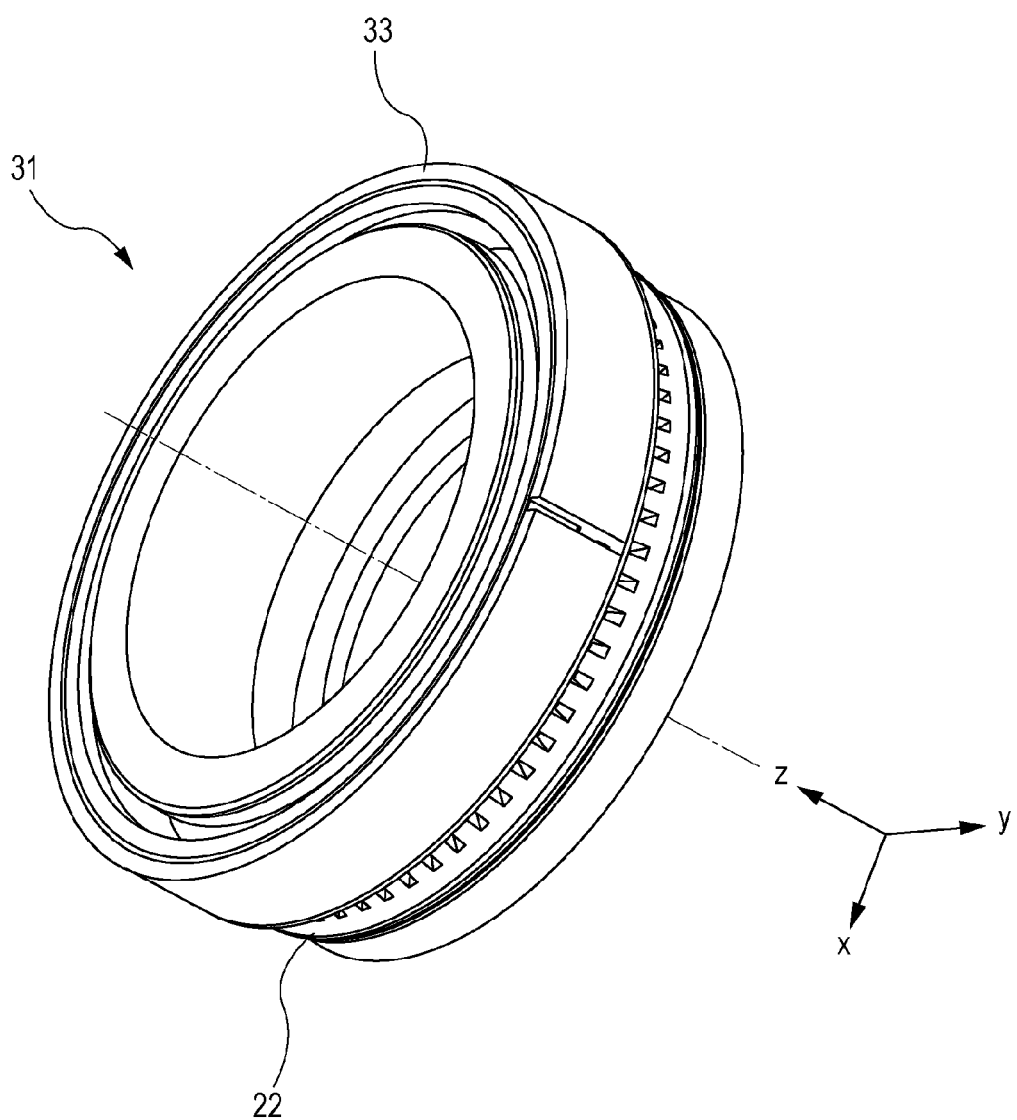
FIG. 8 is a schematic perspective view of a vibration type drive device.
Figure 9:
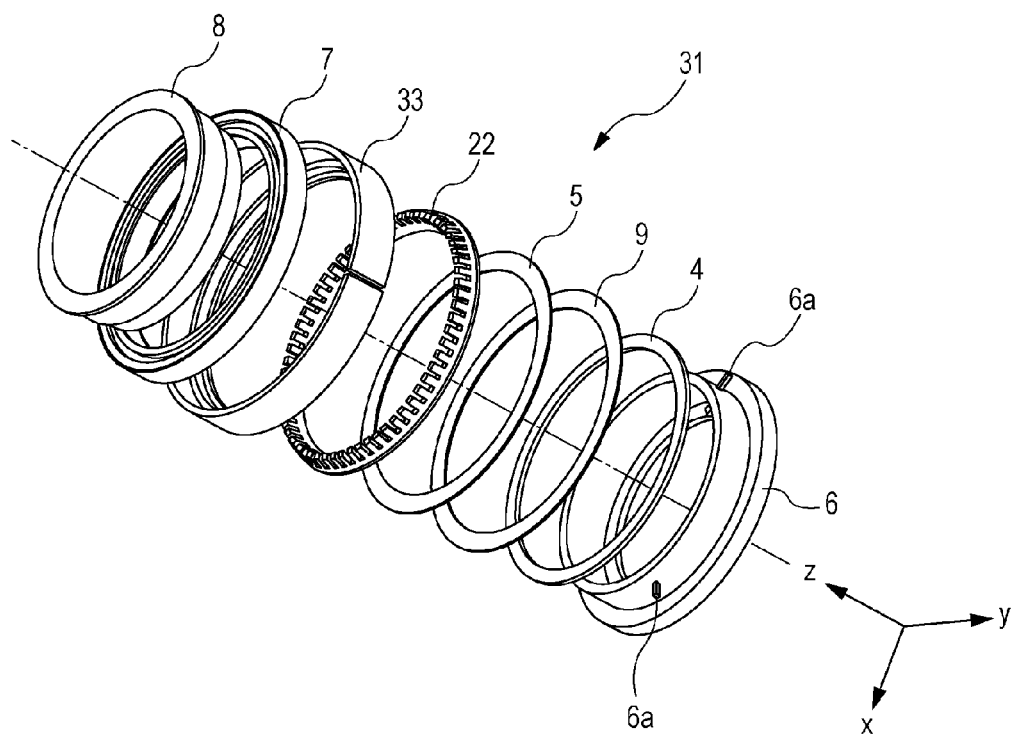
FIG. 9 is a schematic perspective view of the vibration type drive device illustrated in a three-dimensionally disassembled manner.
Figure 10A:
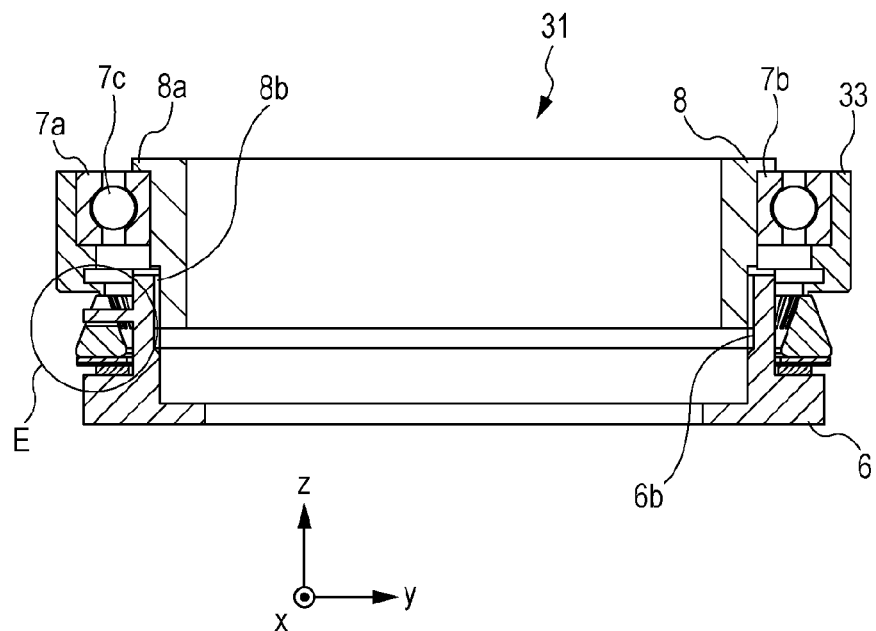
FIG. 10A is a schematic cross-sectional view of the vibration type drive device.

FIG. 8 is a schematic perspective view of a vibration type drive device 31 in the third embodiment of the disclosure. A schematic perspective view illustrating the vibration type drive device 31 in FIG. 8 disassembled three dimensionally illustrated in FIG. 9. A schematic cross-sectional view taken along a cross section y-z passing through a center axis of the vibration type drive device 31 in FIG. 8 viewed in a positive direction of an x-axis is illustrated in FIG. 10A. An enlarged detailed drawing of a circled portion E in FIG. 10A is illustrated in FIG. 10B.

Figure 10B:
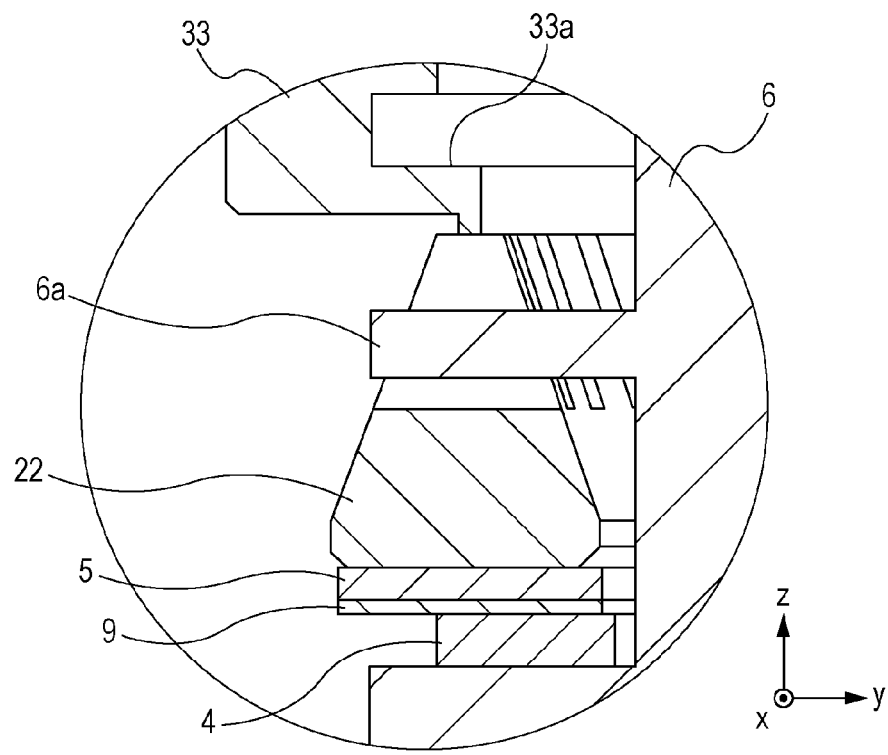
FIG. 10B is an enlarged view of a portion E of FIG. 10A.

In FIGS. 10A and 10B, the cross section is illustrated by hatching.

First of all, a structure and an operation principle of the vibration type drive device 31 will be described. Reference numeral 22 denotes the resilient member as in Embodiment 2, and the piezoelectric element 5 is secured on the back surface thereof. In the same manner as Embodiment 1, by exciting the number of a natural vibration which matches a vibration mode in the bending direction of the resilient member 22, a displacement in the axial direction, and a displacement in the driving direction orthogonal thereto (for example, the circumferential direction) may be obtained on the upper end surface of the resilient member 22.

In contrast, a driven member 33 is a member provided with a resilient portion 33a as illustrated in FIG. 10B, and is formed into a C-shape having a clearance between one end and the other end in a y-z plane. The resilient portion 33a acts as a resilient element in the axial direction and follow the displacement of the resilient member 22 in the axial direction, and hence constitutes a mechanism which is capable of taking out the displacement in the driving direction efficiently from the displacement of the resilient member 22 at the upper end thereof in the same manner as the resilient member 3a of Embodiment 1.

Subsequently, a supporting mechanism in the vibration type drive device 31 will be described. The resilient member 22 is supported by the first supporting member 6, the driven member 33 is supported by the second supporting member 7, and a supporting method is the same as that of Embodiment 1.

In the vibration type drive device 31 of this embodiment as well, selection of material and designing of the member are performed so that the conductive material does not form a closed loop in the same manner as Embodiment 1. The nonwoven fabric 4, the piezoelectric element 5, the first supporting member 6, the second supporting member 7, the pressurizing member 8, and the electric substrate 9 of this embodiment may be formed of, for example, the same materials and configurations as those of Embodiment 1. The resilient member 22 may be formed of the same material and the configuration as those of Embodiment 2. A non-magnetic metallic material having a relatively lower magnetic susceptibility such as beryllium copper or phosphor bronze is employed for the driven member 33 in order to achieve resilient characteristics with high degree of accuracy in the axial direction of the resilient portion 33a. Here, the driven member 33 is formed of the conductive material, and is formed into a C-shape, which is an ended arcuate shape. Therefore, the driven member 33 may be configured not to have a closed loop formed by the conductive material.

According to this embodiment, the vibration type drive device which does not include the closed loop formed of the conductive material on the electric substrate and members other than the electrodes provided on the piezoelectric element may be provided. Therefore, for example, even when the vibration type drive device is used in the vicinity or in the interior of the magnetic resonance imaging apparatus, an effect of reducing the noise with respect to the magnetic resonance imaging apparatus is expected. Generation of unnecessary mechanical vibrations may be reduced.

In this embodiment, the respective members are formed of the same materials as those in Embodiment 2. However, the vibration type drive device 31 of the embodiment is not limited to the material described above. The members of the vibration type drive device 31 may be formed of any material and design, as long as the material or the design which does not include the closed loop formed of the conductive material is applied to the respective members. In this embodiment, an example in which the non-magnetic metallic material such as beryllium copper or phosphor bronze is used as the driven member 33 has been described. However, other metallic materials may also be used, and the non-metallic conductive materials may also be used. Furthermore, in the same manner as Embodiment 2, in order to obtain the desirable friction characteristics, a member equivalent to the contact member 25 may be provided between the resilient member 22 and the driven member 33. Also, the following design may be employed instead of providing the contact member 25. For example, application of fiber reinforced plastic (FRP) containing glass fiber (GF) and carbon fiber (CF) as filler is also conceivable as the driven member 33 in order to obtain an adequate rigidity. The glass fiber (GF) and carbon fiber (CF) added as the filler act as a hard abrasion-resistant material, and also contribute to securement of a stable friction force. In addition, in order to improve the sliding property, a fluorine-type resin such as polytetrafluoroethylene (PTFE) or a heat resistant resin such as polyimide (PI) may be contained. Also, in order to improve the friction force, non-oxide ceramics such as silicon carbide (SiC) or titanium carbide (TiC) may be contained in ceramics or a resin material. A coating film of a non-metallic material such as diamond-like carbon (DLC) or non-oxide such as the silicon carbide (SiC) or the titanium carbide (TiC) may be formed as a surface layer of the contact member. The same surface treatment may be performed on the surface layer of the resilient member 22.

In this embodiment, the embodiment relating to the vibration type drive device of a ring-shaped rotation driving type has been described. However, the vibration type drive device of the disclosure is not limited thereto. The disclosure is further applicable to a solid rotational type drive system, and the vibration type drive devices of a direct operated driving type, an in-plane driving type and a spherical driving type.

Embodiment 4

Referring now to FIG. 11 to FIG. 14B, a fourth embodiment of the disclosure will be described. Coordinate axes illustrated in the drawings are common. The description of portion common to Embodiments 1 and 3 is omitted, and the common part will be described by using the same reference numeral.

Figure 11:
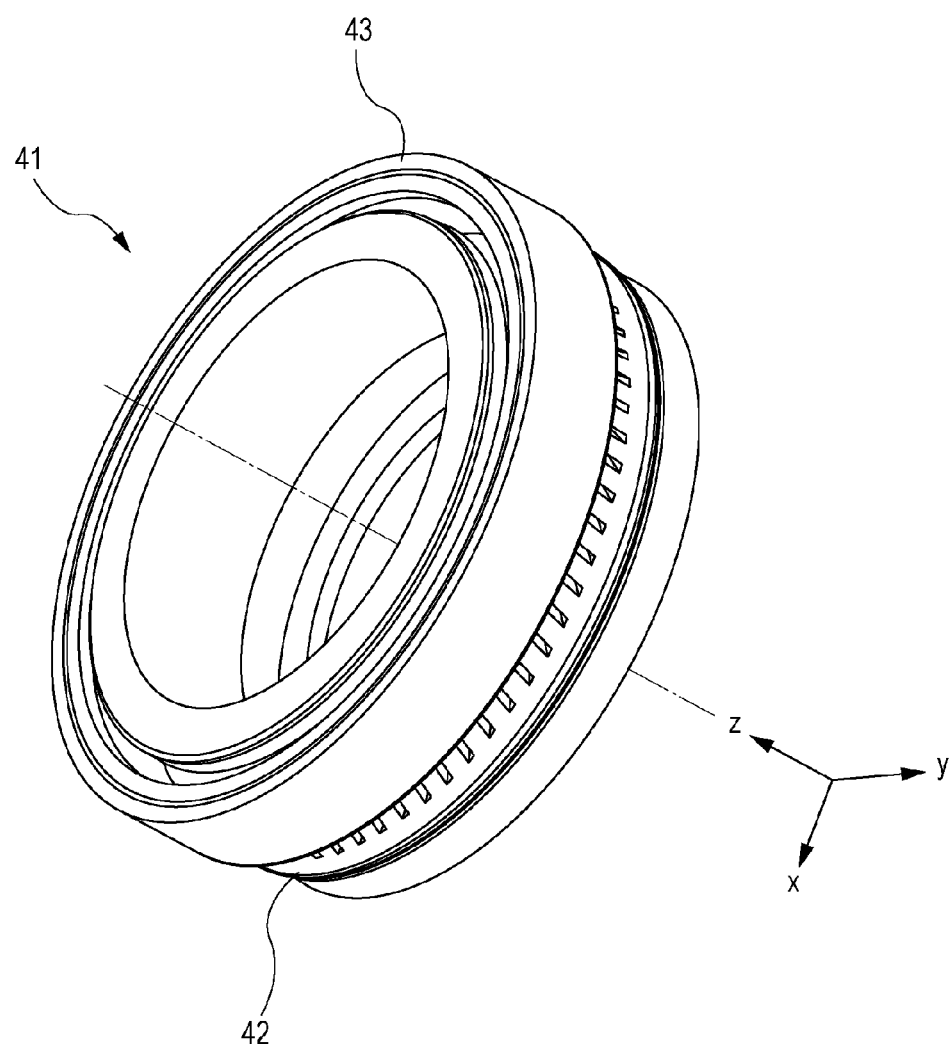
FIG. 11 is a schematic perspective view of a vibration type drive device.
Figure 12:
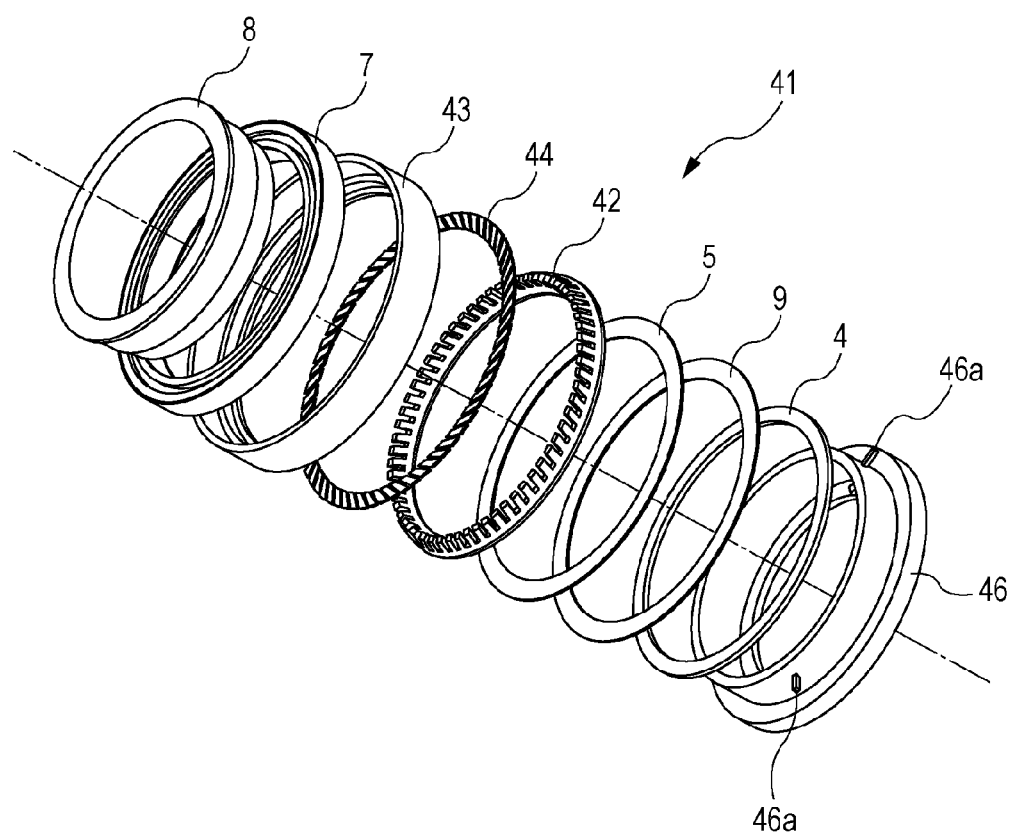
FIG. 12 is a schematic perspective view of the vibration type drive device illustrated in a three-dimensionally disassembled manner.
Figure 13A:
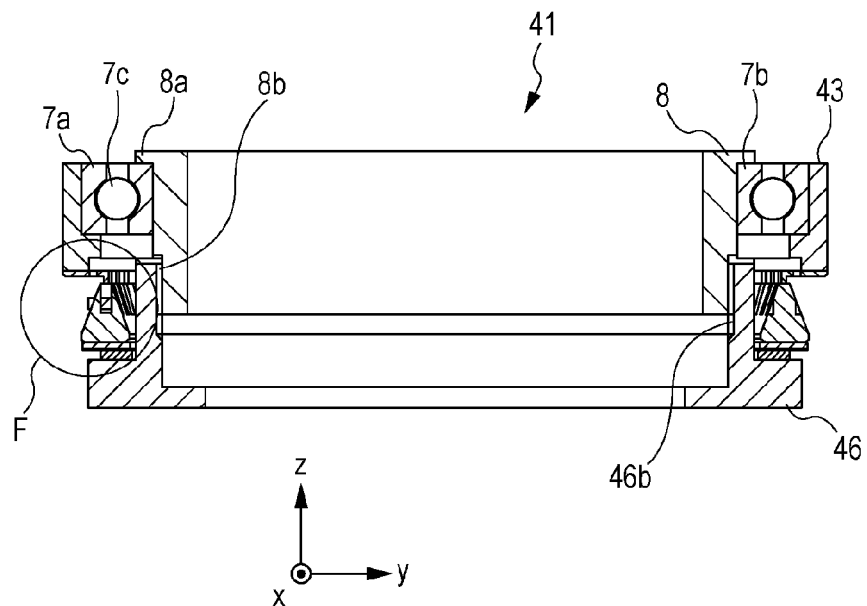
FIG. 13A is a schematic cross-sectional view of the vibration type drive device.
Figure 13B:
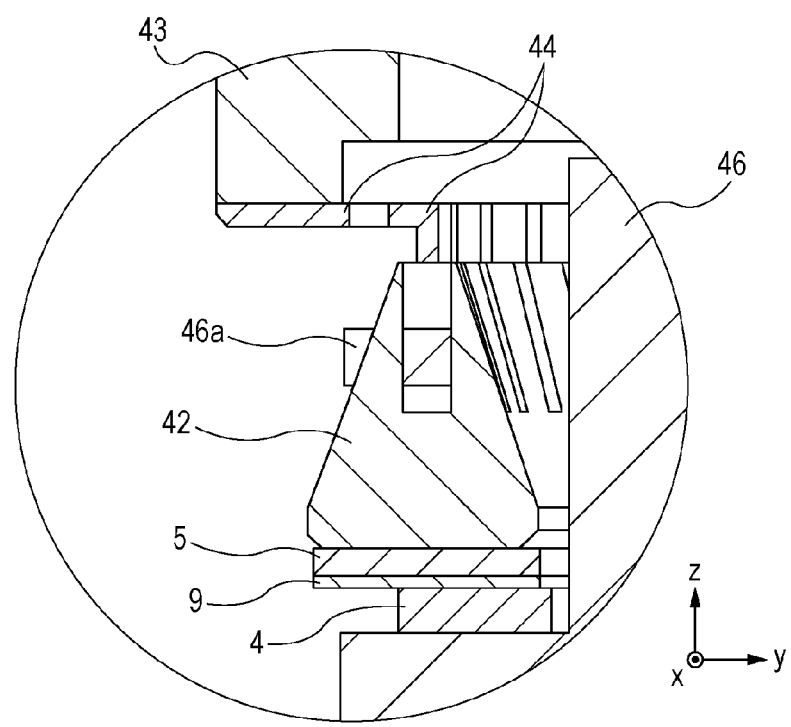
FIG. 13B is an enlarged view of a portion F of FIG. 13A.

FIG. 11 is a schematic perspective view of a vibration type drive device 41 in the fourth embodiment of the disclosure. A schematic perspective view illustrating the vibration type drive device 41 in FIG. 11 in a three-dimensionally disassembled manner is illustrated in FIG. 12. A schematic cross-sectional view taken along a cross section y-z passing through a center axis of the vibration type drive device 41 in FIG. 11 viewed in a positive direction of an x-axis is illustrated in FIG. 13A. An enlarged detailed drawing of a circled portion F in FIG. 13A is illustrated in FIG. 13B. In FIGS. 13A and 13B, the cross section is illustrated by hatching.

First of all, a structure and an operation principle of the vibration type drive device 41 will be described. Reference numeral 42 denotes a resilient member, the piezoelectric element 5 as an example of a mechanical energy application element is secured on a back surface thereof, and is provided with grooves inclining with respect to the radial direction in the circumferential direction as illustrated in the drawing. In the same manner as the Embodiment 1, by exciting a natural vibration which matches a vibration mode in the bending direction of the resilient member 42, a displacement in the axial direction, a displacement in the driving direction orthogonal thereto (for example, the circumferential direction) may be obtained on an upper end surface of the resilient member 42.

In this embodiment, the driven member includes a driven member body 43 and a plurality of contact resilient members 44 provided between the driven member body 43 and the resilient member 42. The driven member body 43 is a ring-shaped member as illustrated in the drawing, and the plurality of contact resilient members 44 are secured at a lower end thereof in the circumferential direction. A plurality of contact resilient members 44 are configured in such a manner that spaces are provided between one contact resilient member and the adjacent contact resilient members 44. It is also possible to fill the clearances with a non-conductive resin material or the like instead of providing the spaces. The contact resilient members 44 act as resilient elements in the axial direction and follow a displacement in the axial direction of the resilient member 42, and hence constitute a mechanism which is capable of taking out the displacement in the driving direction efficiently from the displacement of the resilient member 42 at an upper end thereof in the same manner as the resilient member 3a of Embodiment 1.

Figure 14A:
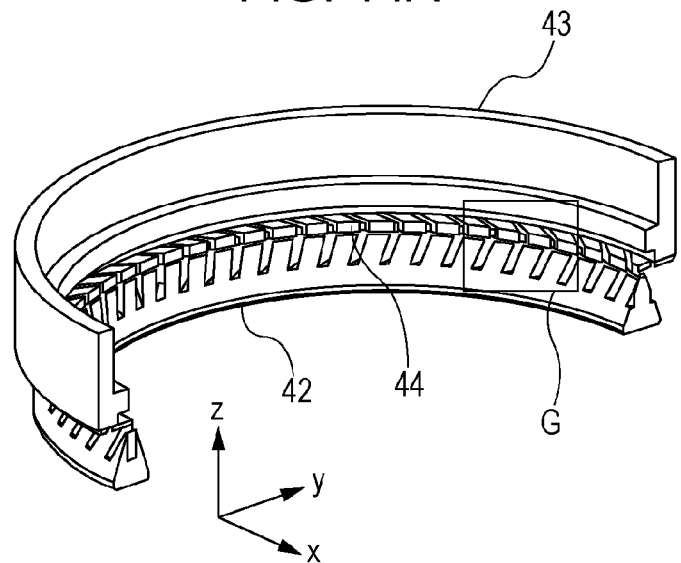
FIG. 14A is a schematic perspective view illustrating only a resilient member, a driven member, and a resilient portion.
Figure 14B:
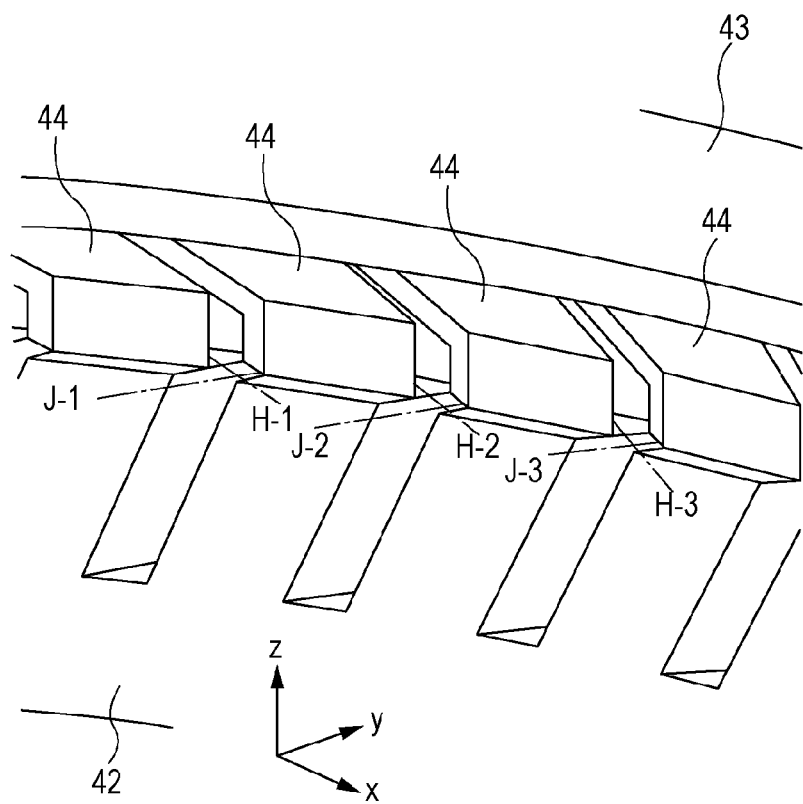
FIG. 14B is an enlarged view of a portion G of FIG. 14A.

In this embodiment, both of the resilient member 42 and the plurality of contact resilient members 44 arranged circumferentially have a shape including depressed and projected portions in contact portions between the resilient member 42 and the contact resilient members 44 arranged circumferentially. A relationship of the shape and arrangement of grooves of the resilient member 42 and the plurality of contact resilient members 44 for obtaining preferable contact state even through the contact between shapes including the depressed and projected portions will be described with reference to FIGS. 14A and 14B. FIG. 14A is a schematic perspective view illustrating only the resilient member 42, the driven member body 43, and the contact resilient members 44 in the vibration type drive device 41 taken along a plane passing through a center axis of the driven member body 43 and parallel to a y-z plane. Also, an enlarged detailed view of G surrounded by a square in FIG. 14A is illustrated in FIG. 14B. In the resilient member 42, the grooves are provided linearly, and the direction thereof are indicated by alternate long and short dash lines J-1, J-2, and J-3 in FIG. 14B. In contrast, centerlines between the adjacent contact resilient members 44 secured to the driven member body 43 are indicated by alternate long and short dash lines H-1, H-2, and H-3. In FIG. 14B, all of the alternate long and short dash lines J-1, J-2, J-3, H-1, H-2, and H-3 are assumed to be on the same plane parallel to the x-y plane. In the configuration of this embodiment, the directions J-1, J-2, and J-3 in which the grooves of the resilient member 42 are provided, and the directions H-1, H-2, and H-3 in which the clearances provided between the contact resilient members 44 are substantially orthogonal to each other. The contact resilient members 44 may be formed by being adhered to the driven member body 43. In the same manner as Embodiment 1, improvement of productivity is achieved by being manufactured by in-mold injection composed of steps of installing the contact resilient members 44 in advance in a die, and manufacturing the driven member body 43 thereon by injection molding.

Subsequently, a supporting mechanism in the vibration type drive device 41 will be described. The resilient member 42 is supported by the first supporting member 46. The first supporting member 46 includes holding mechanisms 46a at every 120° intervals in the radial direction and, as illustrated in FIG. 13B, the resilient member 42 is constrained and supported in the radial direction by the holding mechanisms 46a being fitted into the grooves of the resilient member 42. A unit including the electric substrate 9, the piezoelectric element 5, and the resilient member 42 integrated with each other is held on the nonwoven fabric 4 arranged on the first supporting member 46. In contrast, the driven member body 43 is supported by the second supporting member 7, and a supporting method is the same as that of Embodiment 1. In the drawing, the holding mechanisms 46a are illustrated as part of the first supporting member 46. However, the first supporting member 46 may be composed of two or more members such as forming the first supporting member 46 and the holding mechanisms 46a as separate members considering easiness of assembly of the resilient member 42 into the first supporting member 46.

In the vibration type drive device 41 of this embodiment as well, selection of material and designing of the member are performed so that the conductive material does not form a closed loop in the same manner as Embodiments 1 to 3.

The nonwoven fabric 4, the piezoelectric element 5, the first supporting member 46, the second supporting member 7, the pressurizing member 8, and the electric substrate 9 of this embodiment may be formed of the same materials as the nonwoven fabric 4, the piezoelectric element 5, the first supporting member 6, the second supporting member 7, the pressurizing member 8, and the electric substrate 9 of Embodiment 1 respectively, so that detailed description will be omitted. The resilient member 42 may be formed of the same material and configuration as the resilient member 22 of Embodiment 2, and the detailed description will be omitted.

The driven member body 43 is formed of fiber reinforced plastic (FRP) including the filler such as glass fiber (GF) added thereto, and a non-magnetic metallic material having a relatively low magnetic susceptibility such as beryllium copper or phosphor bronze is employed for the contact resilient members 44 in order to obtain resilient characteristics with high degree of accuracy in the axial direction. In order to enhance the natural frequency matching the driving frequency of the driven member body, forming the driven member body 43 of alumina ($Al_2O_3$) or the like is also effective. Here, the contact resilient member 44 are formed of the conductive material, and the shape thereof is an ended arcuate shape. Therefore, the contact resilient members 44 may be configured not to have a closed loop formed by the conductive material.

According to this embodiment, the vibration type drive device which does not include the closed loop formed of the conductive material on the electric substrate and members other than the electrodes provided on the piezoelectric element may be provided. Therefore, for example, even when the vibration type drive device is used in the vicinity or in the interior of the magnetic resonance imaging apparatus, an effect of reducing the noise with respect to the magnetic resonance imaging apparatus is expected. Generation of unnecessary mechanical vibrations may be reduced.

Furthermore, as illustrated in FIGS. 14A and 14B, by arranging the grooves of the resilient member 42 and the clearances provided between the contact resilient members 44 to be substantially orthogonal to each other, a stable sliding property between the resilient member 42 having the depressed and projected shapes and the resilient member 42 may be secured. In this embodiment, although the contact resilient members 44 are formed of a metal, the clearances are provided between the adjacent contact resilient members 44. Therefore, the contact resilient members of this embodiment have less total amount of metal in the interior of the member than the contact resilient members having a structure in which no clearance is provided between two metallic contact resilient members. Therefore, since the total amount of metal in the interior of the vibration type drive device may be reduced, for example, an effect of reducing the influence on the image formation by the magnetic resonance imaging apparatus is achieved from this point of view.

The vibration type drive device 41 of the disclosure is not limited to the above-described material, as long as the material or the design which does not include the closed loop formed of the conductive material is applied to the respective members. In this embodiment, an example in which the metallic material is used as the contact resilient members 44 has been described. However, other metallic materials may also be used, and the non-metallic conductive materials may also be used. Furthermore, in the same manner as Embodiment 2, in order to obtain the desirable friction characteristics as in Embodiment 2, a member equivalent to the contact member 25 may be provided between the resilient member 42 and the contact resilient members 44. Also, the following design may be employed instead of providing the contact member 25. For example, application of fiber reinforced plastic (FRP) containing glass fiber (GF) and carbon fiber (CF) as filler is also conceivable as the contact resilient members 44 in order to obtain an adequate rigidity. In this case, the glass fiber (GF) and carbon fiber (CF) added as the filler act as a hard abrasion-resistant material, and also contribute to securement of a stable friction force. In addition, in order to improve the sliding property, a fluorine-type resin such as polytetrafluoroethylene (PTFE) or a heat resistant resin such as polyimide (PI) may be contained. Also, in order to improve the friction force, non-oxide ceramics such as silicon carbide (SiC) or titanium carbide (TiC) may be contained in ceramics or a resin material. A coating film of a non-metallic material such as diamond-like carbon (DLC) or non-oxide such as the silicon carbide (SiC) or the titanium carbide (TiC) may be formed as a surface layer of the contact member. The same surface treatment may be performed on a surface layer of the resilient member 42.

In this embodiment, the embodiment relating to the vibration type drive device of a ring-shaped rotation driving type has been described. However, the vibration type drive device of the disclosure is not limited thereto. The disclosure is further applicable to a solid rotational type drive system, and the vibration type drive devices of a direct operated driving type, an in-plane driving type, and a spherical driving type.

Embodiment 5

Referring now to FIG. 15 to FIG. 18F, a fifth embodiment of the disclosure will be described. Coordinate axes illustrated in the drawings are common. The description of portion common to Embodiments 1 and 4 is omitted, and the common part will be described by using the same reference numeral.

Figure 15:
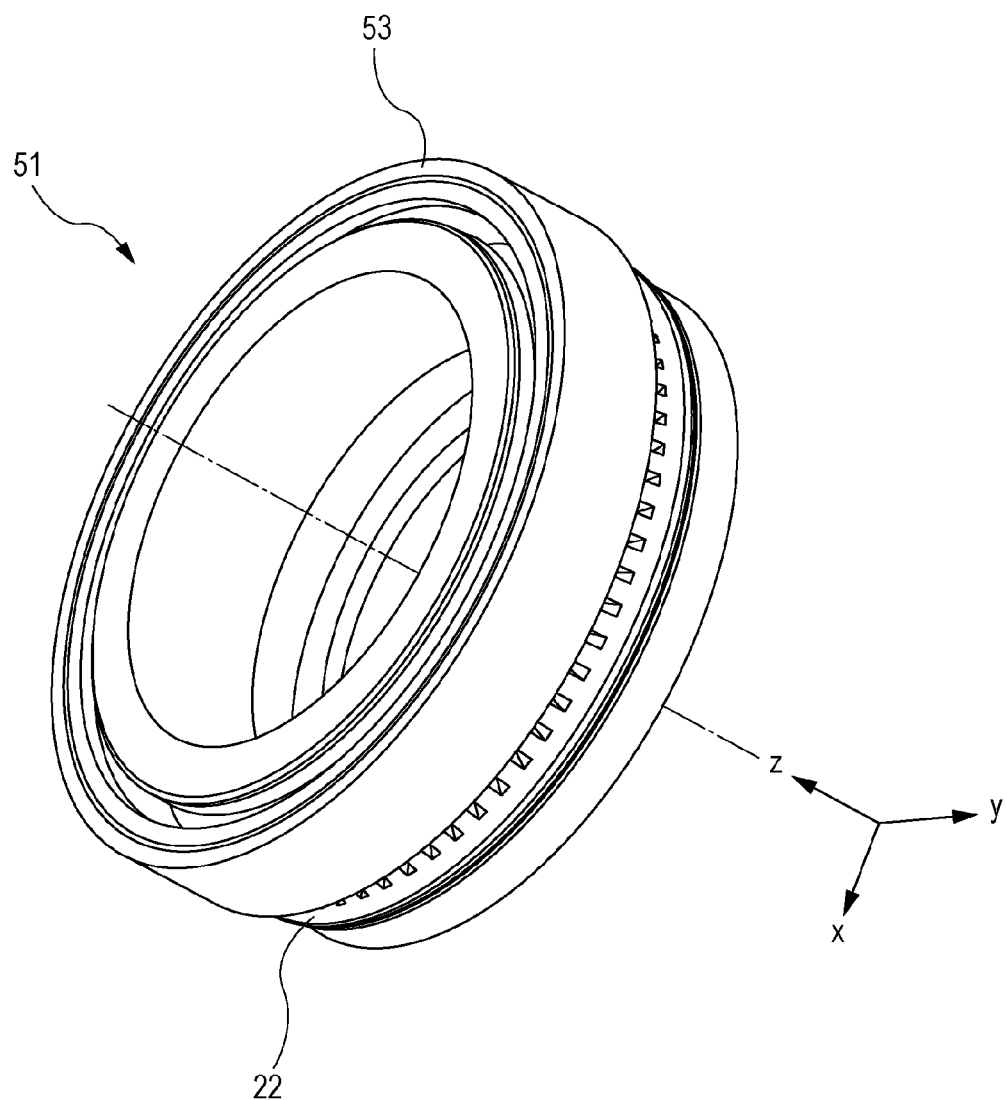
FIG. 15 is a schematic perspective view of a vibration type drive device.
Figure 16:
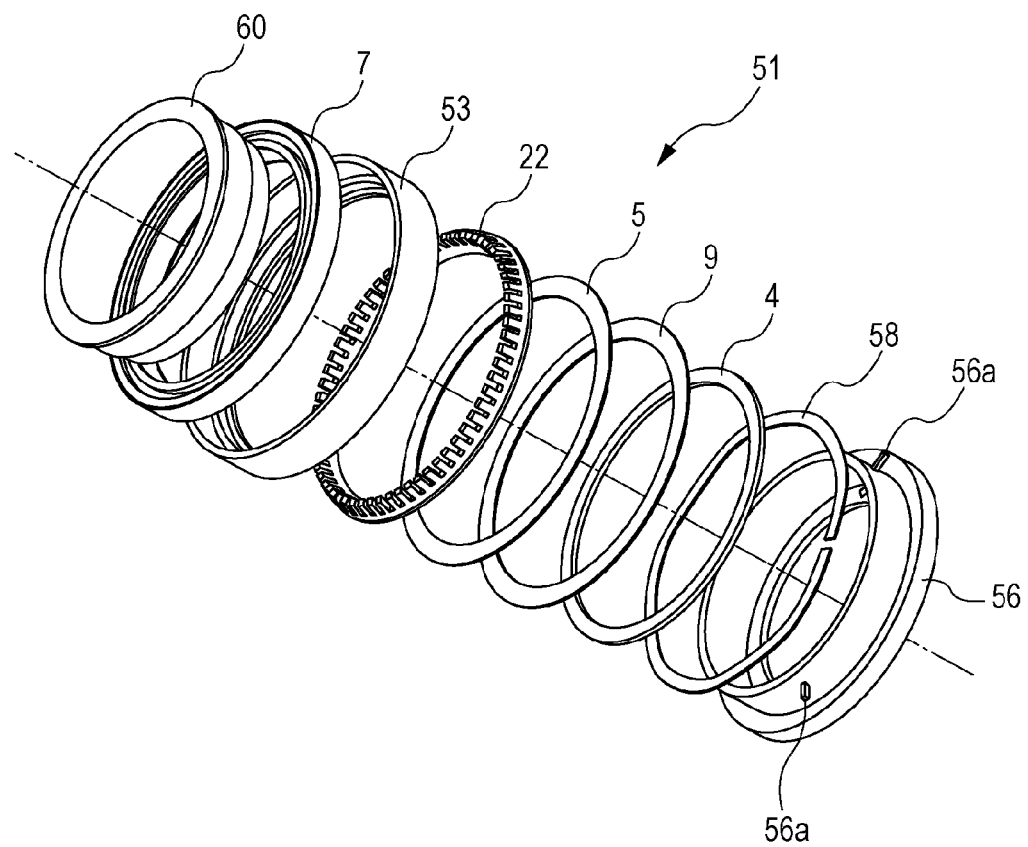
FIG. 16 is a schematic perspective view of the vibration type drive device illustrated in a three-dimensionally disassembled manner.
Figure 17A:
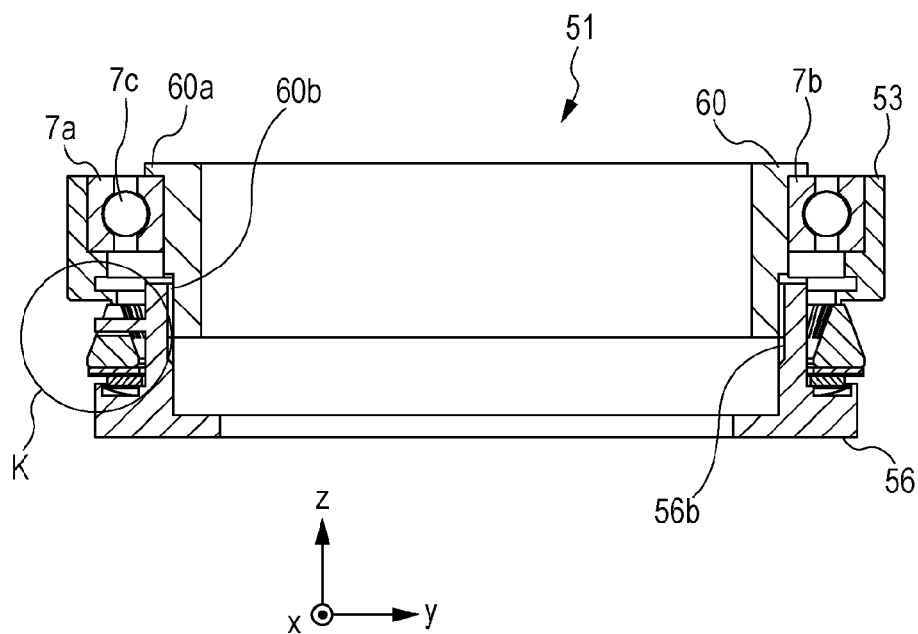
FIG. 17A is a schematic cross-sectional view of the vibration type drive device.
Figure 17B:
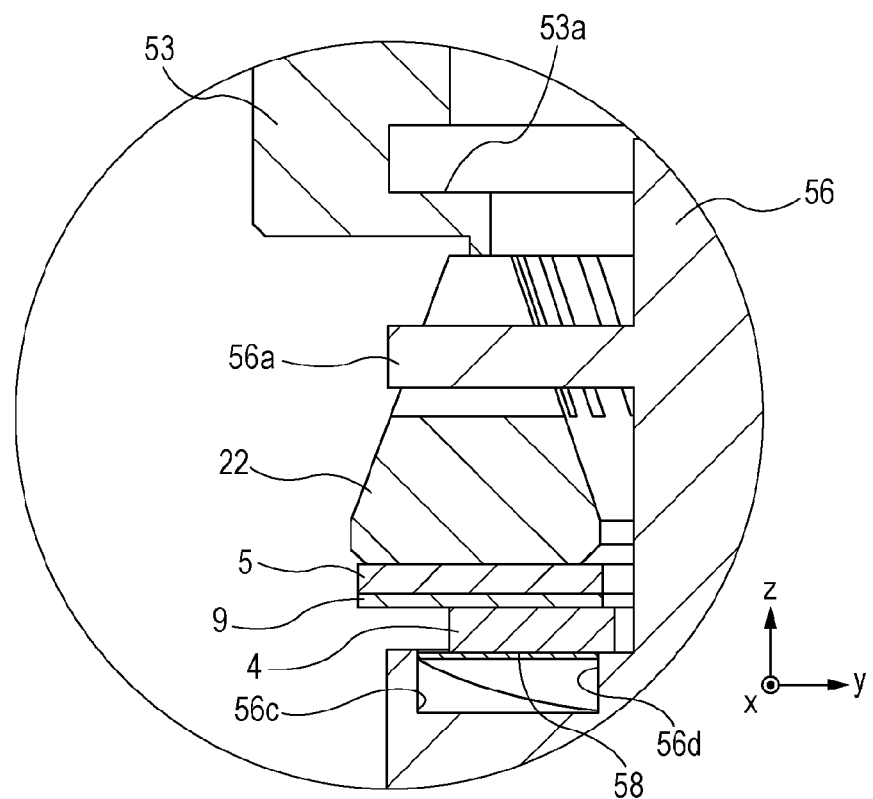
FIG. 17B is an enlarged view of a portion K of FIG. 17A.

FIG. 15 is a schematic perspective view of a vibration type drive device 51 in the fifth embodiment of the disclosure. A schematic perspective view illustrating the vibration type drive device 51 in FIG. 15 illustrated in a three-dimensionally disassembled manner is illustrated in FIG. 16. A schematic cross-sectional view taken along a cross section y-z passing through a center axis of the vibration type drive device 51 in FIG. 15 viewed in a positive direction of an x-axis is illustrated in FIG. 17A. An enlarged detailed drawing of a circled portion K in FIG. 17A is illustrated in FIG. 17B. In FIGS. 17A and 17B, the cross section is illustrated by hatching.

First of all, a structure and an operation principle of the vibration type drive device 51 will be described. Reference numeral 22 denotes the resilient member, and a mechanical energy application element is provided. For example, the piezoelectric element 5 is secured to the back surface of the resilient member 22. The resilient member 22 is provided with grooves circumferentially as illustrated in the drawing. In the same manner as Embodiment 1, by exciting the natural vibration which matches a vibration mode in the bending direction of the resilient member 22, displacements in the axial circumferential direction and the driving direction orthogonal thereto (for example, the circumferential direction) may be obtained on the upper end surface of the resilient member 22.

In contrast, a driven member 53 is a ring-shaped member as illustrated in FIGS. 17A and 17B, and resilient members 53a are provided at a lower end thereof in the circumferential direction. The resilient members 53a act as resilient elements in the axial direction and follow a displacement of the resilient member 22 in the axial direction, and hence constitute a mechanism which is capable of taking out the displacement in the driving direction efficiently from the displacement of the resilient member 22 at the upper end thereof in the same manner as the resilient member 3a of Embodiment 1.

Subsequently, a supporting mechanism in the vibration type drive device 51 will be described. The resilient member 22 is supported by a first supporting member 56. The first supporting member 56 includes holding mechanisms 56a at every 120° intervals in the radial direction and, as illustrated in FIG. 17B, the resilient member 22 is constrained and supported in the radial direction by the holding mechanisms 56a being fitted into the grooves of the resilient member 22. A unit including the electric substrate 9, the piezoelectric element 5, and the resilient member 22 integrated is held on the first supporting member 56 via a nonwoven fabric 4 and the pressurizing member 58. In the drawing, the holding mechanisms 56a are illustrated as part of the first supporting member 56. However, the first supporting member 56 may be formed of two or more members such as forming the first supporting member 56 and the holding mechanisms 56a as separate members considering easiness of assembly of the resilient member 22 into the first supporting member 56.

The pressurizing member 58 has a configuration which does not have a closed loop (electrical closed loop) formed of the conductive material. For example, the pressurizing member 58 has a configuration which has an ended arcuate portion including the conductive material, and in which the ended arcuate portion does not have a portion overlapping with other portion of the ended arcuate shaped portion in the pressurizing direction of the pressurizing member. It is for preventing part of the pressurizing member from coming into contact with other portions and preventing the closed loop formed of the conductive material from being formed when a force in the pressurizing direction (z-axis direction) with respect to the pressurizing member 58 and the pressurizing member 58 is deformed in the z-axis direction.

Figure 18A:
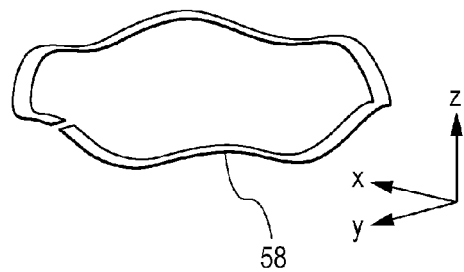
FIG. 18A to FIG. 18F are schematic cross-sectional views of a pressurizing member.

The pressurizing member 58 has, for example, a wavy washer structure having a C-shape as illustrated in FIG. 18A for acting as a compression spring in the z-axis direction. Also, the first supporting member 56 is provided with guides 56c and 56d at portions coming into contact with the pressurizing member 58, and the pressurizing member 58 is configured to be capable of expanding and contracting in the z-axis direction along the guides 56c and 56d in order to reduce the deformation thereof in the x-y plane when being pressurized in the z-axis direction.

Figure 18B:
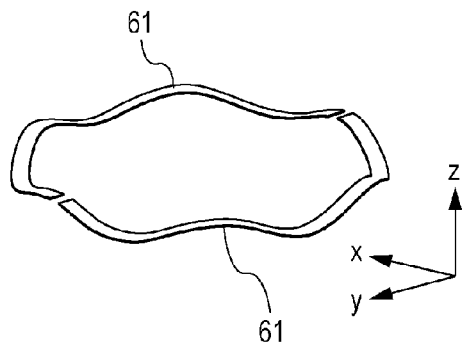
Figure 18C:
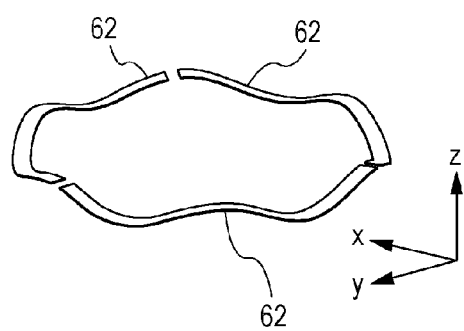
Figure 18D:
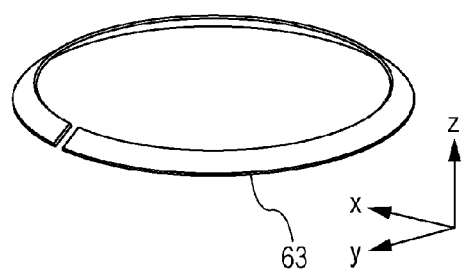
Figure 18E:
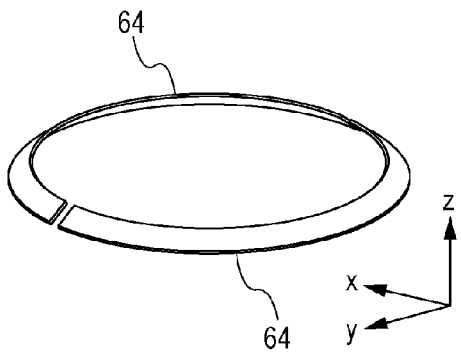
Figure 18F:
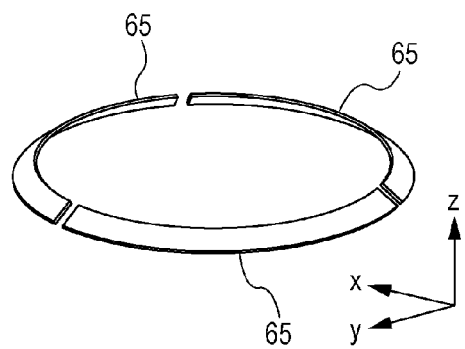

The configuration of the pressurizing member is not limited to the configuration illustrated in FIG. 18A. As another example of configuration, a pressurizing member 61 having two pieces of C-shaped wavy washer structures as illustrated in FIG. 18B, or a pressurizing member 62 having three pieces of C-shaped wavy washer structures as illustrated in FIG. 18C are also applicable. The number of the wavy washer structures is not limited as long as the pressurizing member does not form a conductive closed loop. Also, the pressuring member is not limited to the wavy washer structure, and may be formed of a pressurizing member 63 having a C-shaped disc spring structure as illustrated in FIG. 18D. As an example of configuration having other disc spring structures, a pressurizing member 64 having two pieces of C-shaped disc spring structures as illustrated in FIG. 18E, or a pressurizing member 65 having three pieces of C-shaped wavy washer structures as illustrated in FIG. 18F are also applicable. The number of the disc spring structures is not limited as long as the pressurizing member does not form a conductive closed loop. The configuration of the pressurizing member is not limited to the configuration having structures such as the wavy washer or the disc spring.

Subsequently, a method of supporting the driven member 53 will be described. Reference numeral 7 denotes a second supporting member configured to support the driven member 53. The second supporting member 7 is the radial ball bearing and is the same as Embodiment 1. The driven member 53 and the second supporting member 7 are supported by fitting of the outer diameter of the outer wheel 7a. The upper end portion of the inner wheel 7b and a flange 60a provided on a tightening member 60 are in a contact state, and a male screw 60b provided on an outer periphery of the tightening member 60 and a female screw 56b provided on an inner periphery of the first supporting member 56 are tightened. In this configuration, the resilient member 22 and the driven member 53 are pressurized by an adequate load in the axial direction. In this manner, by pressurizing the driven member 53 toward the resilient member 22 at the adequate load, not only the clearance of the radial ball bearing may be eliminated to enhance the supporting rigidity, but also preferable friction characteristics suitable for driving may be obtained.

Materials of the respective components of the vibration type drive device 51 of this embodiment will be described.

The nonwoven fabric 4, the piezoelectric element 5, the first supporting member 56, the second supporting member 7, and the electric substrate 9 of this embodiment may be formed of the same materials as those of Embodiment 1, so that detailed description will be omitted. The resilient member 22 may be formed of the same material and the configuration as the resilient member 22 of Embodiment 2, and the detailed description will be omitted. The tightening member 60 may be formed of the same material as the pressurizing member 8 of Embodiment 2. When the flange 60a is not required to have the resilient characteristics with high degree of accuracy, the flange 60a may be formed of a non-conductive material such as engineering plastic, machineable ceramics, and fine ceramics.

In order to provide the resilient member 53a with resilient characteristics with high degree of accuracy, the driven member 53 may be formed by compression molding by using a non-conductive fiber reinforced plastic including filler such as glass fiber (GF) added thereto in the same manner as the driven member 3 of Embodiment 1. The glass fiber (GF) added as the filler acts as a hard abrasion-resistant material, and also contributes to securement of a stable friction force. In addition, in order to improve the sliding property, a fluorine-type resin such as polytetrafluoroethylene (PTFE) or a heat resistant resin such as polyimide (PI) may be contained. Also, in order to improve the friction force, non-oxide ceramics such as silicon carbide (SiC) or titanium carbide (TiC) may be contained in ceramics or a resin material. A coating film of a non-metallic material such as diamond-like carbon (DLC) or non-oxide such as the silicon carbide (SiC) or the titanium carbide (TiC) may be formed as a surface layer of the contact member. The same surface treatment may be performed on the surface layer of the resilient member 22.

The pressurizing member 58 is formed of non-magnetic metal such as phosphor bronze or beryllium copper, which are often used for a wavy washer (wave washer) or a disc spring. The pressurizing member 58 may be formed of other non-magnetic metals.

According to this embodiment, the vibration type drive device which does not include the conductive closed loop on the electric substrate and members other than the electrodes provided on the piezoelectric element may be provided. Therefore, for example, even when the vibration type drive device is used in the vicinity or in the interior of the magnetic resonance imaging apparatus, an effect of reducing the noise with respect to the magnetic resonance imaging apparatus may be expected. Generation of unnecessary mechanical vibrations may be reduced.

The pressurizing member for obtaining a pressurizing force in the z-axis direction is advantageously designed compactly by using the pressurizing member 58 having a wavy washer shape as in this embodiment.

The vibration type drive device 51 of the disclosure is not limited to the above-described material, as long as the material or the design which does not constitute the closed loop formed of the conductive material is applied to the respective members. In this embodiment, an example in which the metallic material is used as the pressurizing member 58 has been described. However, other metallic materials may also be used, and the non-metallic conductive materials may also be used. Furthermore, in the same manner as Embodiment 2, in order to obtain the desirable friction characteristics, a member equivalent to the contact member 25 described in Embodiment 2 may be provided between the resilient member 22 and the driven member 53. In this embodiment, an example in which the resilient member 22 is formed of partially stabilized zirconia (PSZ) has been described. However, the resilient member 22 may be formed of other materials such as engineering plastic, fine ceramics, or machineable ceramics.

In this embodiment, the embodiment relating to the vibration type drive device of a ring-shaped rotation driving type has been described. However, the vibration type drive device of the disclosure is not limited thereto. The disclosure is further applicable to a solid rotational type drive system, and the vibration type drive devices of a direct operated driving type, an in-plane driving type, and a spherical driving type.

Embodiment 6

In this embodiment, an example of application of the vibration type drive device of the disclosure will be described. The vibration type drive device of the present disclosure may be used in a case of performing diagnosis, measurement, and medical treatment using the magnetic field in the space. For example, the vibration type drive device of the disclosure may be used in a medical apparatus used in the vicinity or in the interior of the magnetic resonance imaging apparatus will be described. Also, a medical system having the medical apparatus using the vibration type drive device of the disclosure in the vicinity or in the interior of the magnetic resonance imaging apparatus may be provided.

In this embodiment, the medical apparatus includes a medical instrument, a holding portion configured to hold the medical instrument and configured to be movable, and a vibration type drive device mounted on the holding portion and configured to move the holding portion. In this configuration, the medical treatment may be performed with the medical apparatus while acquiring image information of a patient by the magnetic resonance imaging apparatus.

As regards the medical apparatus, an example in which a medical manipulator as the image apparatus, an arm as the holding portion, and an end effector as the medical instrument are used will be described with reference to FIG. 19 and FIG. 20. The medical instrument is not limited thereto, and instruments such as a knife, forceps, a needle, a probe, and instruments for diagnosis are included. The medical treatment also includes not only therapies such as operation, but also diagnosis and the like.

Figure 19:
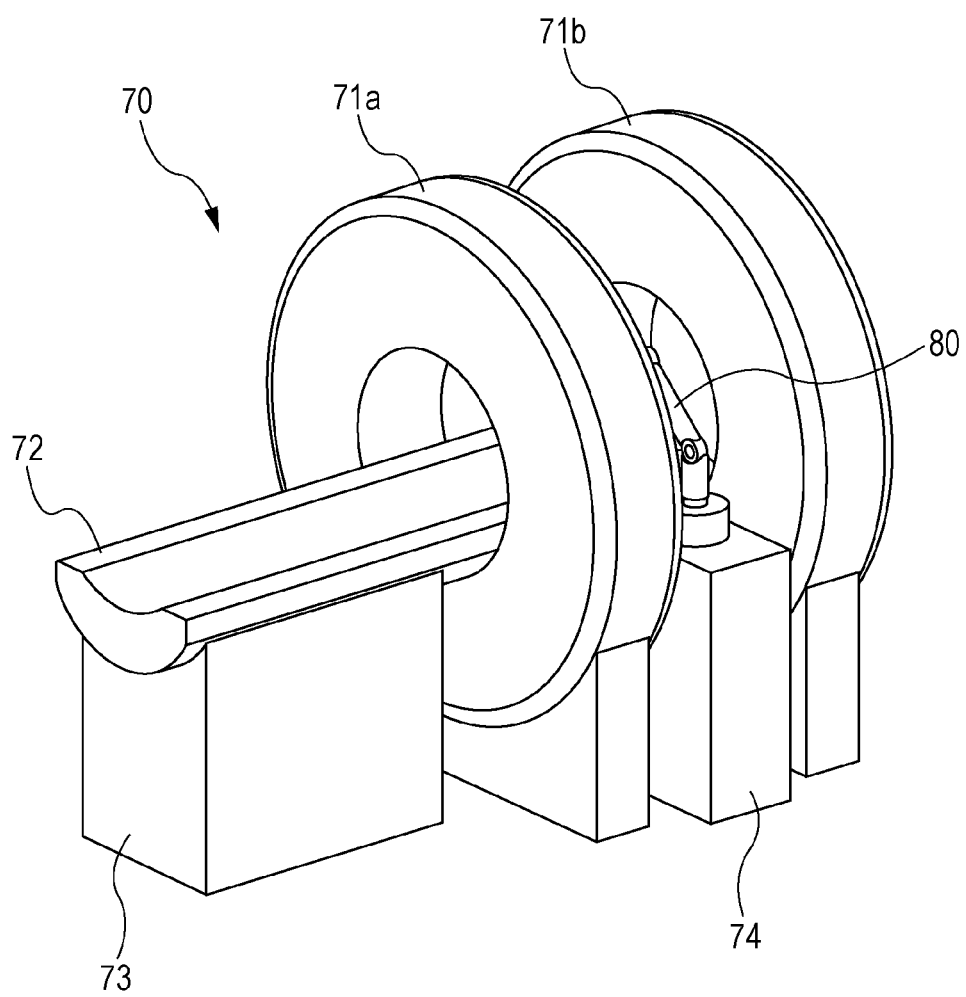
FIG. 19 is a schematic perspective view schematically illustrating an open magnetic resonance imaging apparatus.
Figure 20:
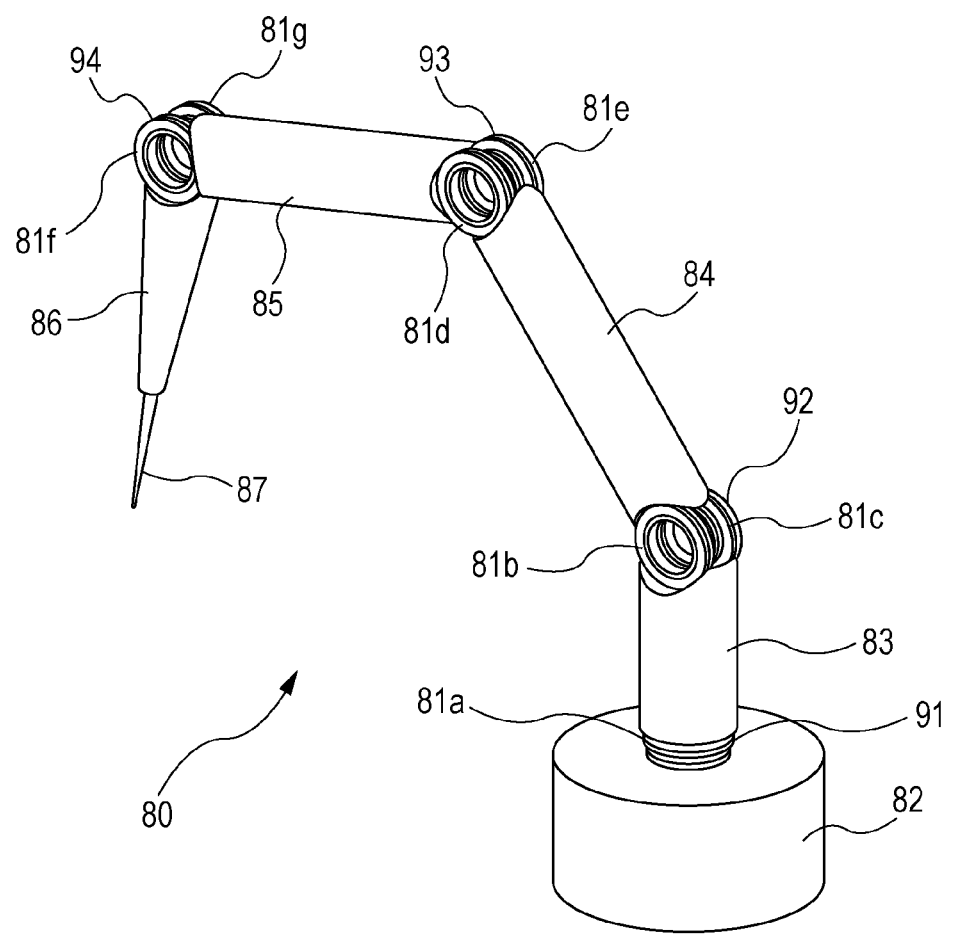
FIG. 20 is a schematic perspective view of a medical manipulator.

FIG. 19 is a schematic perspective view schematically illustrating a magnetic resonance imaging apparatus 70 in which a medical manipulator 80 of the disclosure is installed. Here, an example in which an open magnetic resonance imaging apparatus of double-doughnut type is used is illustrated as the magnetic resonance imaging apparatus. In FIG. 19, reference numeral 72 denotes a treatment table for allowing a patient to lie, reference numeral 73 denotes a supporting base of the treatment table 72, and 71a and 71b denote magnets as components of the magnetic resonance imaging apparatus and have a cylindrical shape in this case. A manipulator installation table 74 for installing the medical manipulator 80 is installed between the cylindrical magnets 71a and 71b. Since the manipulator 80 is installed between the cylindrical magnets 71a and 71b, the medical treatment by the manipulator 80 while acquiring the image information by the magnetic resonance imaging apparatus is enabled.

Subsequently, a detailed structure of the medical manipulator 80 will be described with reference to FIG. 20. The medical manipulator 80 has a structure of four-axis vertical multi-joint arm having a first arm 83, a second arm 84, a third arm 85, and a fourth arm 86 via a first joint 91, a second joint 92, a third joint 93, and a fourth joint 94 having freedom in degrees of rotation, respectively. Vibration type drive devices 81a to 81g provided with the resilient member, the driven member, the first supporting member configured to support the resilient member, and the second supporting member configured to support the driven member and the like described in Embodiments 1 to 5 are arranged, so that driving torque may be imparted on the respective joints. Also, an end effector 87 is mounted at a distal end of the fourth arm 86 for performing given medical treatments such as needling, ablation, and gripping.

Subsequently, mounting structures of the respective vibration type drive devices will be described. The first supporting member of the vibration type drive device 81a is fixed to a manipulator base table 82, the second supporting member is fixed to the first arm 83, and the vibration type drive device 81a has a structure capable of imparting a rotation torque about the first joint 91. The first supporting members of the vibration type drive devices 81b and 81c are both fixed to the first arm 83, and the second supporting members of the vibration type drive devices 81b and 81c are both fixed to the second arm 84. The vibration type drive devices 81b and 81c have a structure capable of imparting a rotation torque about the second joint 92. The first supporting members of the vibration type drive devices 81d and 81e are both fixed to the second arm 84, and the second supporting members of the vibration type drive devices 81d and 81e are both fixed to the third arm 85. The vibration type drive devices 81d and 81e have a structure capable of imparting a rotation torque about the third joint 93. The first supporting members of the vibration type drive devices 81f and 81g are both fixed to the third arm 85, and the second supporting members of the vibration type drive devices 81f and 81g are both fixed to the fourth arm 86. The vibration type drive devices 81f and 81g have a structure capable of imparting a rotation torque about the second joint 94.

Subsequently, a material of the medical manipulator 80 will be described. Any one of the vibration type drive devices of Embodiments 1 to 5 is used as the vibration type drive devices 81a to 81g. Therefore, vibration type drive devices 51a to 51g are configured so as not to have a closed loop formed of the conductive material in all the components except for the respective electric substrates and the electrodes of the piezoelectric elements. Also, the manipulator base table 82, the first arm 83, the second arm 84, the third arm 85, and the fourth arm 86 are all formed of a non-magnetic material.

According to this embodiment, the medical manipulator may be installed in the vicinity of the cylindrical magnet of the magnetic resonance imaging apparatus. Furthermore, the medical manipulator in which the influence on the magnetic field of the magnetic resonance imaging apparatus is minimized may be provided. Therefore, even when the vibration type drive device is used in the vicinity or in the interior of the magnetic resonance imaging apparatus, an effect of reducing arch fact or the noise of the image with respect to the magnetic resonance imaging apparatus is expected. By arranging the vibration type drive devices of the disclosure directly at the joints of the medical manipulator, motive power transmitting mechanisms such as gears and belts may be reduced, so that the response of the manipulator may be enhanced. Also, as in this embodiment, by arranging a plurality of the vibration type drive devices of the disclosure at the joints, the drive torque may be compensated.

In this embodiment, an example in which the medical manipulator is installed in the interior of the open magnetic resonance imaging apparatus of double-doughnut type has been described as the magnetic resonance imaging apparatus. However, the magnetic resonance imaging apparatus is not limited thereto. Also, although the four-axis multi-joint type manipulator has been described as the medical manipulator the manipulator may be of a horizontal multi-joint type or of a parallel link mechanism type, and the degree of freedom of the manipulator, the place of installation and the number of the vibration type drive devices are not limited. The embodiment relating to the medical manipulator in which the vibration type drive device of the rotation driving type are arranged directly in the joint has been described. However, the vibration type drive device of the disclosure is not limited thereto. As the vibration type drive device, the vibration type drive devices of a direct operated driving type, an in-plane driving type, and a spherical driving type may be used and the motive power transmitting mechanism may be provided as a drive torque application unit to the joint.

According to the disclosure, a vibration type drive device which affects less on diagnosis, measurement, and medical treatment even when being used in the vicinity or in the interior of a magnetic field in a space when performing the diagnosis, the measurement, and the medical treatment using the magnetic field, and a medical apparatus and a medical system using the vibration type drive device are provided.

While the invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2012-135445, filed in Jun. 15, 2012, which is hereby incorporated by reference herein in its entirety.

What is claimed is:

1. A vibration type drive device comprising:
a mechanical energy application element;
a resilient member having a ring shape and provided with the mechanical energy application element; and
a driven member subjected to a relative displacement with respect to the resilient member due to a vibration excited by the resilient member,
wherein the resilient member includes a plurality of a first resilient elements each including a conductive material and a plurality of a second resilient elements each including a non-conductive material, and
wherein the plurality of the first resilient element and the plurality of the second resilient element are arranged in an alternate manner in a circumferential direction of the resilient member.

2. The vibration type drive device according to claim 1, wherein the first resilient member has an ended arcuate shape.

3. The vibration type drive device according to claim 1, wherein the resilient member includes a first resilient element having an ended arcuate shape and formed of a conductive material, and a second resilient element formed of a non-conductive material in a circumferential direction.

4. The vibration type drive device according to claim 3, wherein the resilient member includes a plurality of the first resilient elements formed of the conductive material in the circumferential direction, and
wherein spaces are provided between adjacent first resilient elements.

5. The vibration type drive device according to claim 1, wherein the resilient member includes a plurality of grooves.

6. The vibration type drive device according to claim 1, wherein the mechanical energy application element is a piezoelectric element.

7. The vibration type drive device, wherein the vibration type drive device according to claim 1 is a ring-shaped rotation driving type.

8. A medical apparatus comprising:
a medical instrument;
a holding portion configured to hold the medical instrument; and
the vibration type drive device according to claim 1 mounted on the holding portion.

9. A medical system comprising:
a magnetic resonance imaging apparatus; and
the medical apparatus according to claim 8 provided in an interior of the magnetic resonance imaging apparatus.

10. The vibration type drive device according to claim 1, further including a pressurizing member configured to impart a contact pressure between the resilient member and the driven member,
wherein the pressurizing member includes a conductive material, and
wherein the pressurizing member does not constitute an electric closed loop.

11. The vibration type drive device according to claim 10, wherein the pressurizing member includes an ended arcuate shaped portion,
wherein the ended arcuate shaped portion is formed of the conductive material,
wherein the ended arcuate shaped portion does not have a portion overlapping with other portions of ended arcuate shaped portions in a pressurizing direction of the pressurizing member.

12. The vibration type drive device according to claim 11, wherein the ended arcuate portion has a C-shape.

13. The vibration type drive device according to claim 10, wherein the resilient member includes a plurality of grooves.

14. The vibration type drive device according to claim 10, wherein the mechanical energy application element is a piezoelectric element.

15. A vibration type drive device wherein the vibration type drive device according to claim 10 is a ring-shaped rotation driving type.

16. A medical apparatus comprising:
a medical instrument;
a holding portion configured to hold the medical instrument; and
the vibration type drive device according to claim 10 mounted on the holding portion.

17. A medical system comprising:
a magnetic resonance imaging apparatus; and
the medical apparatus according to claim 16 provided in the interior of the magnetic resonance imaging apparatus.

18. The vibration type drive device according to claim 1, wherein the second resilient element is made of reinforced plastic.

19. The vibration type drive device according to claim 18, wherein the second resilient element is made of polyether ether ketone containing glass fiber.

20. The vibration type drive device according to claim 1, wherein the first resilient element contains non-magnetic metal.

21. The vibration type drive device according to claim 1, wherein the first resilient element and the second resilient element are arranged in the circumferential direction of the resilient member so as not to constitute an electrical closed loop.

* * * * *